(12) United States Patent
Kamihara

(10) Patent No.: US 7,047,434 B2
(45) Date of Patent: May 16, 2006

(54) DATA TRANSFER CONTROL DEVICE AND ELECTRONIC EQUIPMENT

(75) Inventor: Yoshiyuki Kamihara, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 578 days.

(21) Appl. No.: 09/984,218

(22) Filed: Oct. 29, 2001

(65) Prior Publication Data

US 2002/0062457 A1 May 23, 2002

(30) Foreign Application Priority Data

Oct. 31, 2000 (JP) ............................. 2000-332493

(51) Int. Cl.
*G06F 1/04* (2006.01)
(52) U.S. Cl. ..................... 713/500; 713/400
(58) Field of Classification Search ................ 713/400, 713/500
See application file for complete search history.

(56) References Cited

U.S. PATENT DOCUMENTS

| | | | |
|---|---|---|---|
| 5,095,280 A | 3/1992 | Wunner et al. | |
| 5,774,701 A | 6/1998 | Matsui et al. | |
| 5,790,609 A * | 8/1998 | Swoboda ..................... | 375/357 |
| 5,844,435 A * | 12/1998 | Grundvig ..................... | 327/151 |
| 6,157,265 A * | 12/2000 | Hanjani ........................ | 331/49 |
| 6,219,797 B1 * | 4/2001 | Liu et al. ..................... | 713/500 |
| 6,452,426 B1 * | 9/2002 | Tamarapalli et al. .......... | 327/99 |
| 6,529,083 B1 * | 3/2003 | Fujita ............................ | 331/49 |
| 6,530,001 B1 | 3/2003 | Lee | |
| 6,587,954 B1 * | 7/2003 | Chiu ............................ | 713/400 |
| 6,618,456 B1 * | 9/2003 | Lansdowne .................. | 375/354 |

FOREIGN PATENT DOCUMENTS

| | | |
|---|---|---|
| EP | 0 969 350 A2 | 5/1999 |
| JP | 02-122317 | 5/1990 |
| JP | 07-123001 | 5/1995 |
| JP | 08-030351 | 2/1996 |
| JP | 10-242856 | 9/1998 |
| JP | A 10-285029 | 10/1998 |
| JP | 2000-183894 | 6/2000 |
| JP | 2000-293257 | 10/2000 |
| JP | 2002-091606 | 3/2002 |
| KR | 2000-0026281 | 5/2000 |

(Continued)

OTHER PUBLICATIONS

Philips Semiconductors, "Universal Serial Bus Standard", May 1996.*

(Continued)

*Primary Examiner*—Lynne H. Browne
*Assistant Examiner*—Tse Chen
(74) *Attorney, Agent, or Firm*—Oliff & Berridge, PLC

(57) ABSTRACT

The objective is to provide a data transfer control device and electronic equipment that make it possible to switch the frequency of a generated clock dynamically, without causing any operating errors. The data transfer control device includes a clock generation circuit which generates clocks CLKH and CLKF and a clock control circuit which generates a system clock SYCLK based on CLKH and CLKF. The autonomous operation of a PLL60M that generates CLKF is enabled before the autonomous operation of a PLL480M that generates CLKH is disabled, and the generation source of SYCLK is switched from CLKH to CLKF after the autonomous operation of the PLL60M has stabilized. On condition that CLKH becomes "0", SYCLK is set to "0" for a given period only; and on condition that CLKF becomes "0", SYCLK is generated based on CLKF. When the mode switches from HS mode FS mode under USB 2.0, the operation of the PLL480M is disabled, reducing the power consumption.

5 Claims, 17 Drawing Sheets

FOREIGN PATENT DOCUMENTS

KR   2000-0061507   10/2000

OTHER PUBLICATIONS

Philips Semiconductors, "Universal Serial Bus Transceiver" Product Specification, May, 29, 1996.*

Lucker, Jon et al., USB 2.0 Transceiver Macrocell Interface (UTMI) Specification, Version 1.0rc, Apr. 25, 2000.

Kobayashi, Yoshikazu, "Lan Business Sodanshitsu", Telecommunication vol. 17 Issue 11, pp. 140-141, Oct. 25, 2000, RIC TELECOM.

* cited by examiner

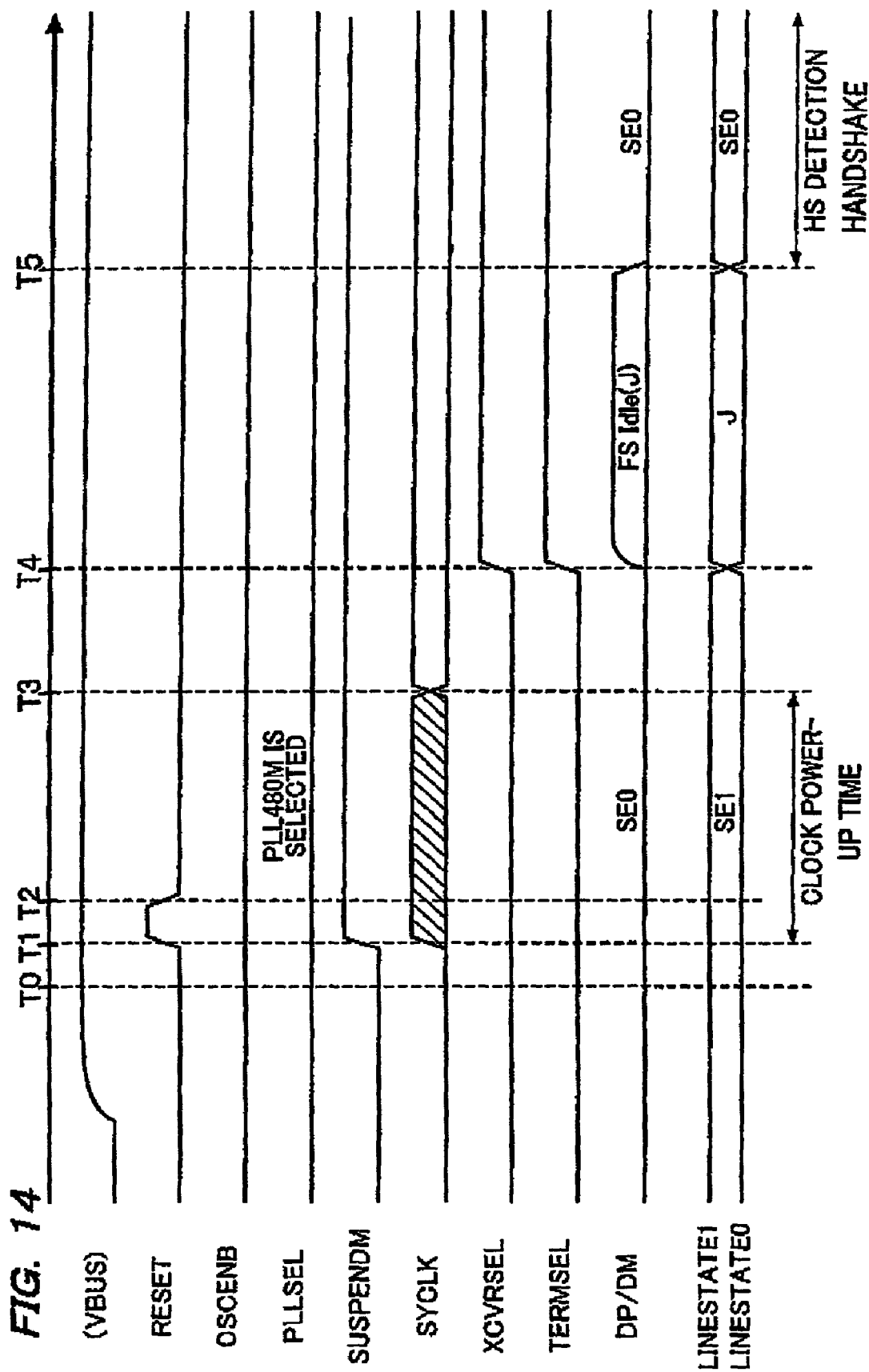

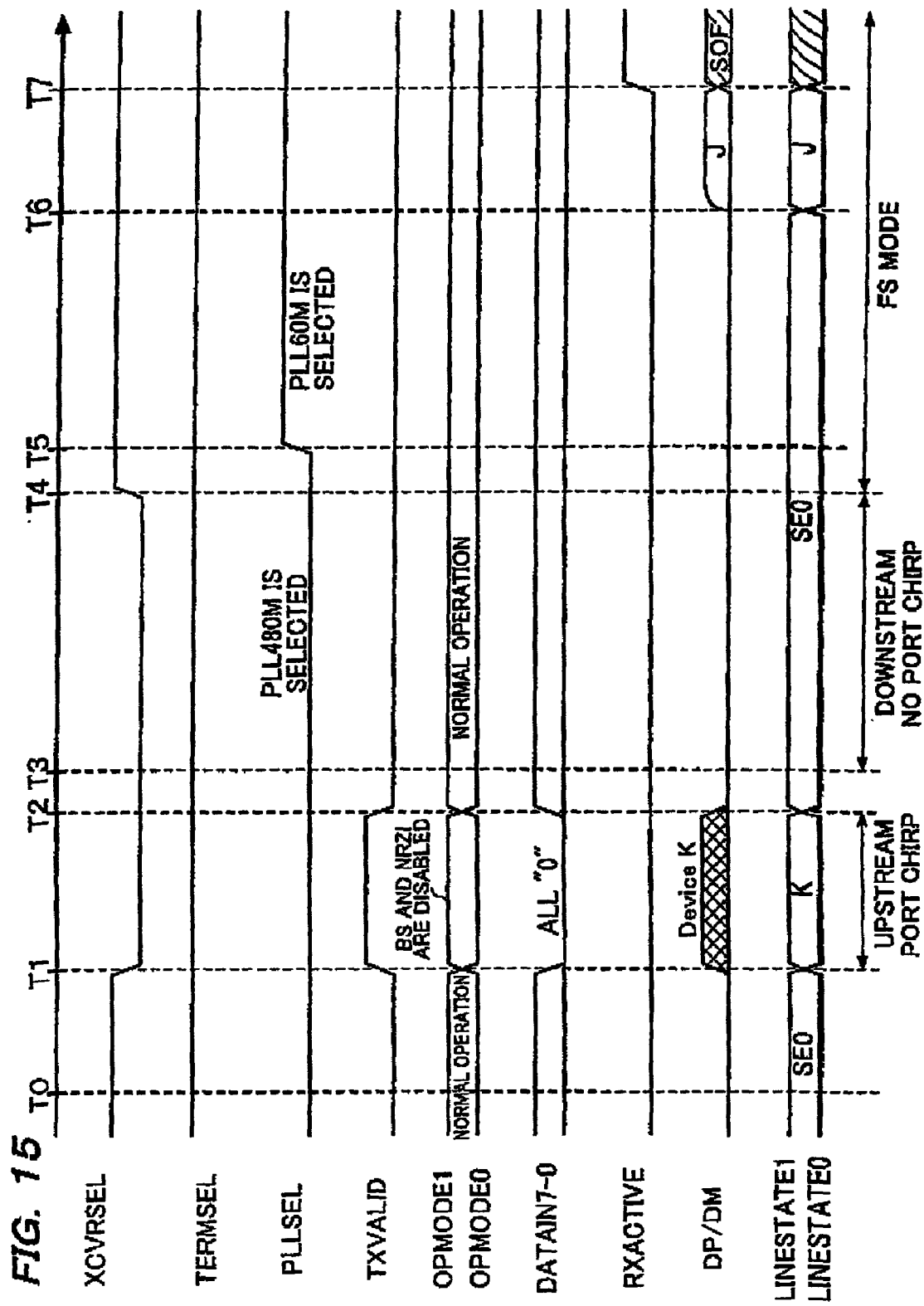

DATA TRANSFER CONTROL DEVICE AND ELECTRONIC EQUIPMENT

Japanese patent application No. 2000-332493 filed Oct. 31, 2000 is hereby incorporated by reference in its entirety.

TECHNICAL FIELD

The present invention relates to a data transfer control device and electronic equipment.

BACKGROUND

The universal serial bus (USB) standard has recently attracted attention as an interface standard for connections between personal computers and peripheral equipment (generally speaking: electronic equipment). This USB standard has the advantage of enabling the use of connectors of the same standard to connect peripheral equipment such as a mouse, keyboard, and printer, which are connected by connectors of different standards in the prior art, and of making it possible to implement plug-and-play and hot-plug features.

In comparison with the IEEE 1394 standard which is also attracting notice as a standard for the same serial bus interface, this USB standard has a problem in that the transfer speed thereof is slower.

In this case, attention is being paid to the decision to use the USB 2.0 standard which can implement a data transfer speed of 480 Mbps (in HS mode), far faster than those of the previous USE 1.1 standard, while maintaining backward compatibility with USB 1.1. The USB 2.0 transceiver macrocell interface (UTMI), which defines interface specifications for the physical-layer and logical-layer circuitry under USB 2.0, has also been decided upon.

SUMMARY

One aspect of the present invention relates to a data transfer control device for transferring data over a bus, the data transfer control device comprising:

a clock generation circuit which generates a plurality of clocks comprising first and second clocks; and a clock control circuit which controls clock generation by the clock generation circuit and generates a system clock that is used by at least one of the data transfer control device and a later-stage data processing circuit, based on a clock generated by the clock generation circuit, wherein the clock control circuit enables an operation of generating the second clock by the clock generation circuit before disabling an operation of generating the first clock by the clock generation circuit, and switches the clock used for generating the system clock from the first clock to the second clock after confirming that the operation of generating the second clock has stabilized.

Another aspect of the present invention relates to a data transfer control device for transferring data over a bus, the data transfer control device comprising:

a clock generation circuit which generates a plurality of clocks comprising first and second clocks; and a clock control circuit which controls clock generation by the clock generation circuit and generates a system clock that is used by at least one of the data transfer control device and a later-stage data processing circuit, based on a clock generated by the clock generation circuit, wherein the clock control circuit sets the system clock to a first level during a given period when the clock used for generating the system clock switches over from the first clock to the second clock.

Yet another aspect of the present invention relates to a data transfer control device for transferring data over a bus, the data transfer control device comprising:

a clock generation circuit which generates a plurality of clocks comprising first and second clocks; and a clock control circuit which controls clock generation by the clock generation circuit and generates a system clock that is used by at least one of the data transfer control device and a later-stage data processing circuit, based on a clock generated by the clock generation circuit, wherein the clock control circuit sets the system clock, which is generated based on the first clock, to a first level on condition that the first clock has become the first level, and generates the system clock based on the second clock on condition that the second clock has become the first level.

A further aspect of the present invention relates to a data transfer control device for performing data transfer over a bus by using a first transfer mode which is high-speed mode or a second transfer mode which is low-speed mode, the data transfer control device comprising:

a clock generation circuit comprising a first PLL (phase locked loop) which generates a first clock and a second PLL which generates a second clock; and a clock control circuit which controls the first and second PLLs comprised within the clock generation circuit, wherein the clock control circuit disables autonomous operation of the first PLL, which generates the first clock used for the first transfer mode, when the transfer mode has been switched from the first transfer mode to the second transfer mode.

BRIEF DESCRIPTION OF THE DRAWINGS

FIG. 14 is a timing waveform chart illustrating device attachment;

FIG. 15 is a timing waveform chart illustrating HS detection handshake;

BRIEF DESCRIPTION

Figure 1:
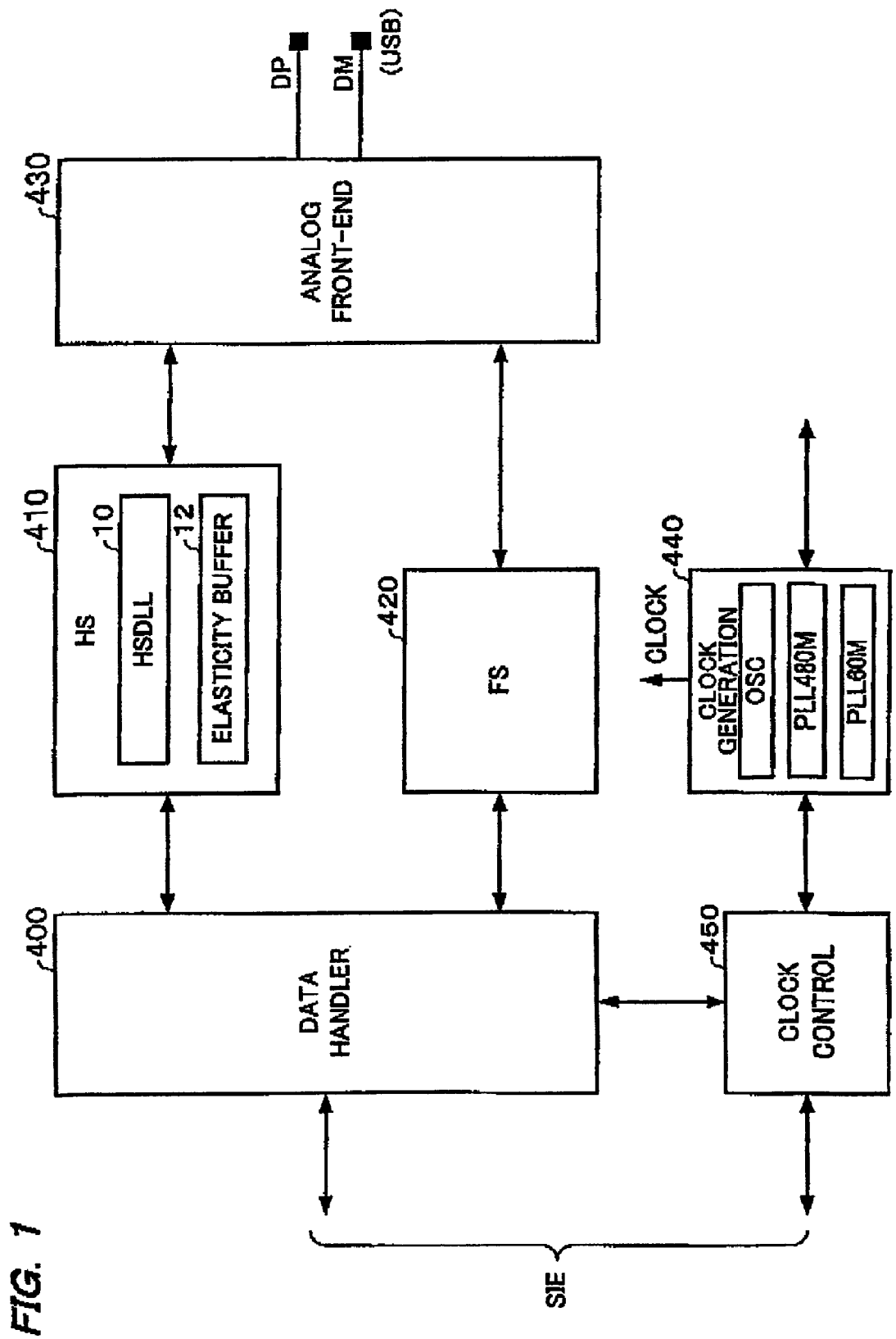
FIG. 1 shows an example of the configuration of a data transfer control device in accordance with an embodiment of the present invention.

Embodiments of the present invention are described below.

Note that the embodiments described below do not in any way limit the scope of the present invention laid out in the claims herein. In addition, all of the configurations described for these embodiments do not limit the components that are essential as requirements of the present invention.

In addition to the full-speed (FS) mode defined by the prior-art USB 1.1, USB 2.0 provided a transfer mode called high-speed (HS) mode. Since data transfer in this HS mode is at 480 Mbps, it is possible to implement data transfer at a much higher speed than the data transfer at 12 Mbps of FS mode. This USB 2.0 therefore makes it possible to provide an interface that is optimal for storage devices such as hard disk drives and optical disk drives that require fast transfer speeds.

During data transfer in this HS mode, however, it is necessary to generate a 480-MHz frequency clock in order to sample the transfer data, raising a problem in that the power consumption of a circuit (FLL) generating a clock at such a high frequency is extremely high. This power is dissipated during data transfer in the slower FS mode, leading to wasteful power consumption.

If the configuration is such that the transfer mode (HS mode and FS mode) is switched and the generated clock is switched, a technical problem arises in that erroneous operation of the data transfer control device itself and later-stage circuitry must be prevented.

The embodiments of the present invention were devised in the light of the above-described technical problems, making it possible to provide a data transfer control device and electronic equipment that are capable of switching the frequency of the generated clock in a dynamic manner but without causing operational errors.

The embodiments can provide a data transfer control device and electronic equipment that make it possible to implement data transfer in different transfer modes, with a reduced power consumption.

In order to solve the above described technical problems, one embodiment of the present invention relates to a data transfer control device for transferring data over a bus, the data transfer control device comprising:

a clock generation circuit which generates a plurality of clocks comprising first and second clocks; and a clock control circuit which controls clock generation by the clock generation circuit and generates a system clock that is used by at least one of the data transfer control device and a later-stage data processing circuit, based on a clock generated by the clock generation circuit, wherein the clock control circuit enables an operation of generating the second clock by the clock generation circuit before disabling an operation of generating the first clock by the clock generation circuit, and switches the clock used for generating the system clock from the first clock to the second clock after confirming that the operation of generating the second clock has stabilized.

This embodiment generates the system clock used within the data transfer control device or by later-stage data processing circuits based on first and second clocks generated by the clock generation circuit. This embodiment also enables the operation of generating the second clock by the clock generation circuit before disabling the operation of generating the first clock. When it is determined that the thus-enabled second clock generation operation has stabilized, the source clock for the generation of the system clock is switched from the first clock to the second clock, so that the system clock generation is based on the second clock instead of the first clock.

This makes it possible to ensure that the output of the second clock from the clock generation has stabilized at the switchover of the clock used as the generation source for the system clock. It is thus possible to switch the clock that is the system clock generation source from the second clock to the first clock. Since this ensures that a stable system clock is supplied to the interior of the data transfer control device or the later-stage data processing circuitry, even at clock switchover, it is possible to prevent erroneous operation.

If the operation of generating the first clock is disabled after the clock switchover, the power that would be consumed by the operation of generating the first clock can be saved, thus reducing the power consumption of the data transfer control device.

With this embodiment, the clock generation circuit may comprise a first PLL (phase locked loop) which generates a first clock and a second PLL which generates a second clock, and the clock control circuit may enable autonomous operation of the second PLL before disabling autonomous operation of the first PLL, and may switch the clock used for generating the system clock from the first clock to the second clock after confirming that the autonomous operation of the second PLL has stabilized.

This makes it possible to supply a stabilized system clock to the interior of the data transfer control device or the later-stage data processing circuitry, and also makes it possible to save the power that would be consumed by the first PLL if the autonomous operation of the first PLL is disabled after the clock switchover.

With this embodiment, the clock control circuit may set the system clock to a first level during a given period when the clock used for generating the system clock switches over from the first clock to the second clock.

This makes it possible to prevent a situation in which a clock that has been placed in an unstable state is supplied to the interior of the data transfer control device or the later-stage data processing circuitry as the system clock. It is also possible to compensate for any difference in phases between the first and second clocks, preventing erroneous operation of the data transfer control device and later-stage data processing circuit.

Note that the processing for setting the system clock to the first level could be implemented by an AND operation of the first or second clock and a mask signal that is at the first level during a given clock-switching period.

With this embodiment, a setting of the given period, during which the system clock is set to a first level, may be based on a base clock used for the clock generation by the clock generation circuit.

This makes it possible to set parameters such as the length of the clock switchover period based on the base clock which is in a stable state at clock switchover. This enables further stabilization of the system clock supplied to the data transfer control device or the later-stage data processing circuitry.

In this embodiment, the clock control circuit may set the system clock, which is generated based on the first clock, to a first level on condition that the first clock has become the first level, and may generate the system clock based on the second clock on condition that the second clock has become the first level.

This makes it possible to fix the system clock at a first level at switchover after the first clock has changed from a second level to the first level, but before it changes back from the first level to the second level, by way of example. This enables efficient prevention of the generation of glitches in the system clock at clock switchover. The generation of the system clock is based on the second clock after the second clock has changed from the second level to the first level, but before it changes back from the first level to the second level. It is therefore possible to prevent a situation in which pulses of the system clock become tiny glitches.

Another embodiment of the present invention relates to a data transfer control device for transferring data over a bus, the data transfer control device comprising:

a clock generation circuit which generates a plurality of clocks comprising first and second clocks; and a clock control circuit which controls clock generation by the clock generation circuit and generates a system clock that is used by at least one of the data transfer control device and a later-stage data processing circuit, based on a clock generated by the clock generation circuit, wherein the clock control circuit sets the system clock to a first level during a given period when the clock used for generating the system clock switches over from the first clock to the second clock.

This embodiment ensures that the generation of the system clock used by the interior of the data transfer control device or the later-stage data processing circuitry is based on the first and second clocks generated by the clock generation circuit. This embodiment also ensures that the system clock is set to the first level at the switchover of the clock used as the generation source of the system clock. It is therefore possible to prevent a situation in which a clock that has been made unstable by the clock switchover is supplied to the interior of the data transfer control device or the later-stage data processing circuitry, and also connect the first and the second clock as suitable even if the phases of the first and second clocks do not match.

Yet another embodiment of the present invention relates to a data transfer control device for transferring data over a bus, the data transfer control device comprising:

a clock generation circuit which generates a plurality of clocks comprising first and second clocks; and a clock control circuit which controls clock generation by the clock generation circuit and generates a system clock that is used by at least one of the data transfer control device and a later-stage data processing circuit, based on a clock generated by the clock generation circuit, wherein the clock control circuit sets the system clock, which is generated based on the first clock, to a first level on condition that the first clock has become the first level, and generates the system clock based on the second clock on condition that the second clock has become the first level.

This embodiment ensures that the generation of the system clock used by the interior of the data transfer control device or the later-stage data processing circuitry is based on the first and second clocks generated by the clock generation circuit. This embodiment also ensures that the system clock can be fixed at the first level after the first clock has changed from the second level to the first level at the switchover of the clock that is to be used as the generation source for the system clock. If the second clock changes from the second level to the first level after the system clock has been fixed at the first level in this manner, the generation of the system clock can be based on the second clock. This configuration makes it possible to prevent the occurrence of glitches in the system clock, thus making it possible to ensure stable operation of the data transfer control device and data processing circuitry in later stages.

Further embodiment of the present invention relates to a data transfer control device for performing data transfer over a bus by using a first transfer mode which is high-speed mode or a second transfer mode which is low-speed mode, the data transfer control device comprising:

a clock generation circuit comprising a first PLL (phase locked loop) which generates a first clock and a second PLL which generates a second clock; and a clock control circuit which controls the first and second PLLs comprised within the clock generation circuit, wherein the clock control circuit disables autonomous operation of the first PLL, which generates the first clock used for the first transfer mode, when the transfer mode has been switched from the first transfer mode to the second transfer mode.

This embodiment makes it possible to perform operations such as data transfer and system clock generation, based on a first clock generated by the first PLL in a high-speed first transfer mode. When a switch from the first transfer mode to a lower-speed second transfer mode occurs, the autonomous operation of the first PLL is disabled. The first PLL that is not necessary in the second transfer mode can therefore be disabled during operation in the second transfer mode, thus preventing any wasteful consumption of power by the first PLL and enabling reductions in the power consumption of the data transfer control device itself.

In this embodiment, it may be detected whether or not a port connected to a bus supports the first transfer mode, in a state of operation in accordance with the first clock generated by the first PLL, and, when it is detected that the first transfer mode is not supported, autonomous operation of the first PLL may be disabled based on a selection signal from a later-stage data processing circuit.

This makes it possible to prevent wasteful power consumption by the first PLL if a port that does not support the first transfer mode is connected to the bus, so that operation is in the second transfer mode, thus reducing the power consumption of the data transfer control device.

In this embodiment, the clock control circuit may enable autonomous operation of the second PLL before disabling autonomous operation of the first PLL, and may disable autonomous operation of the first PLL after confirming that autonomous operation of the second PLL has stabilized.

This makes it possible to use a clock that is output in a stable manner, for use during a switchover from the first clock from the first PLL to the second clock from the second PLL, thus making it possible to ensure stable operation of the data transfer control device.

With this embodiment, data transfer may be in accordance with the universal serial bus (USB) standard.

This makes it possible to implement suitable data transfer in HS mode as regulated by USB 2.0, by way of example.

In addition, this embodiment makes it possible to guarantee stable operation of the data transfer control device at switchover from HS mode to FS mode and at switchover from FS mode to HS mode.

Electronic equipment in accordance with an embodiment of the present invention may comprise any of the above described data transfer control devices, and a device which performs output processing, fetch processing, or storage processing on data transferred through the data transfer control device and the bus.

Since this embodiment makes it possible to reduce the cost and improve the reliability of a data transfer control device used in electronic equipment, it also makes it possible to reduce the cost and improve the reliability of the electronic equipment itself. Since this embodiment also makes it possible to implement data transfer in a high-speed transfer mode, it helps increase the processing speed of the electronic equipment.

This embodiment also makes it possible to use a clock that has been optimized for the transfer mode in use, making it possible to further reduce the power consumption of the electronic equipment.

The above embodiments are described below in detail with reference to the accompanying figures.

1. Configuration and Operation 1.1 Data Transfer Control Device

An example of the configuration of a data transfer control device in accordance with an embodiment of the present invention is shown in FIG. 1.

The data transfer control device of this embodiment of the present invention comprises a data handler circuit 400, a high-speed (HS) circuit 410, a full-speed (FS) circuit 420, an analog front-end circuit 430, a clock generation circuit 440, and a clock control circuit 450. Note that not all of the circuit blocks shown in FIG. 1 are necessary for the data transfer control device of the present invention; some of them may be omitted.

The data handler circuit 400 (generally speaking: a given circuit for performing data transfer) performs various types of processing for transferring data in conformation with a standard such as USB. More specifically, during transmission, it performs processing such as attaching synchronization (SYNC), start of packet (SOP), and end of packet (EOP) codes to the data to be transmitted, and bit stuffing. During reception, on the other hand, it performs processing to detect and remove the SYNC, sop, and EOP codes, and bit unstuffing. In addition it generates various timing signals for controlling the data transfer.

Note that received data is output to a serial interface engine (SIE) that is a circuit (data processing means) in a stage after the data handler circuit 400, and data to be transmitted is input to the data handler circuit 400 from the SIE.

The HS circuit 410 is a logic circuit for transferring data at high speed (HS), which is a data transfer speed of 480 Mbps, and the FS circuit 420 is a logic circuit for transferring data at a full speed (FS), which is a data transfer speed of 12 Mbps.

In this case, HS mode is a new transfer mode that has been defined by USB 2.0. FS mode, on the other hand, is a transfer mode that was defined previously by USB 1.1.

Since USB 2.0 provides this HS mode, it makes it possible to implement not only data transfer for devices such as printers, audio equipment, and cameras, but also data transfer in storage devices such as hard disk drives or optical disk (CD-ROM or DVD) drives.

The US circuit 410 comprises a high-speed delay line PLL (HSDLL) circuit 10 and an elasticity buffer 12.

In this case, the RSDLL circuit 10 is a circuit that generates a data sampling clock based on received data and a clock from the clock generation circuit 440 (PLL).

The elasticity buffer 12 is a circuit for absorbing any difference in clock frequency (clock drift) between the internal device (the data transfer control device) and an external device (an external device connected to the bus).

The analog front-end circuit 430 is an analog circuit comprising drivers and receivers for transfer at FS and HS. With USB, data is transferred by a differential signal, using data-plus (DP) and data-minus (DM) signals.

The clock generation circuit 440 generates a 480-MHz clock used within the device and a 60-MHz clock used within the device and by the SIE.

The clock generation circuit 440 comprises an oscillation circuit (OSC), a PLL480M, and a PLL60M.

In this case, the OSC generates a base clock in combination with another component such as an external oscillator, by way of example.

The PLL480M is a phase-locked loop (PLL) that generates the 480-MHz clock necessary for HS mode as well as the 60-MHz clock necessary for FS mode, various components within the device, and the STE, based on the base clock generated by the OSC. Note that when transfer is in HS mode, it is necessary to validate clock generation by this PLL480M.

The PLL60M generates the 60-MHz clock necessary for FS mode, various components within the device, and the SIR, based on the base clock generated by the oscillation circuit 20. Note that transfer in HS mode is not possible when clock generation by this PLL60M is enabled.

The clock control circuit 450 receives various control signals from the SIE and performs processing such as control of the clock generation circuit 440. Note that the 60-MHz system clock generated by the clock generation circuit 440 is output to the SIE through the clock control circuit 450.

1.2 Configuration of Clock Generation Circuit and Clock Control Circuit

Figure 2:
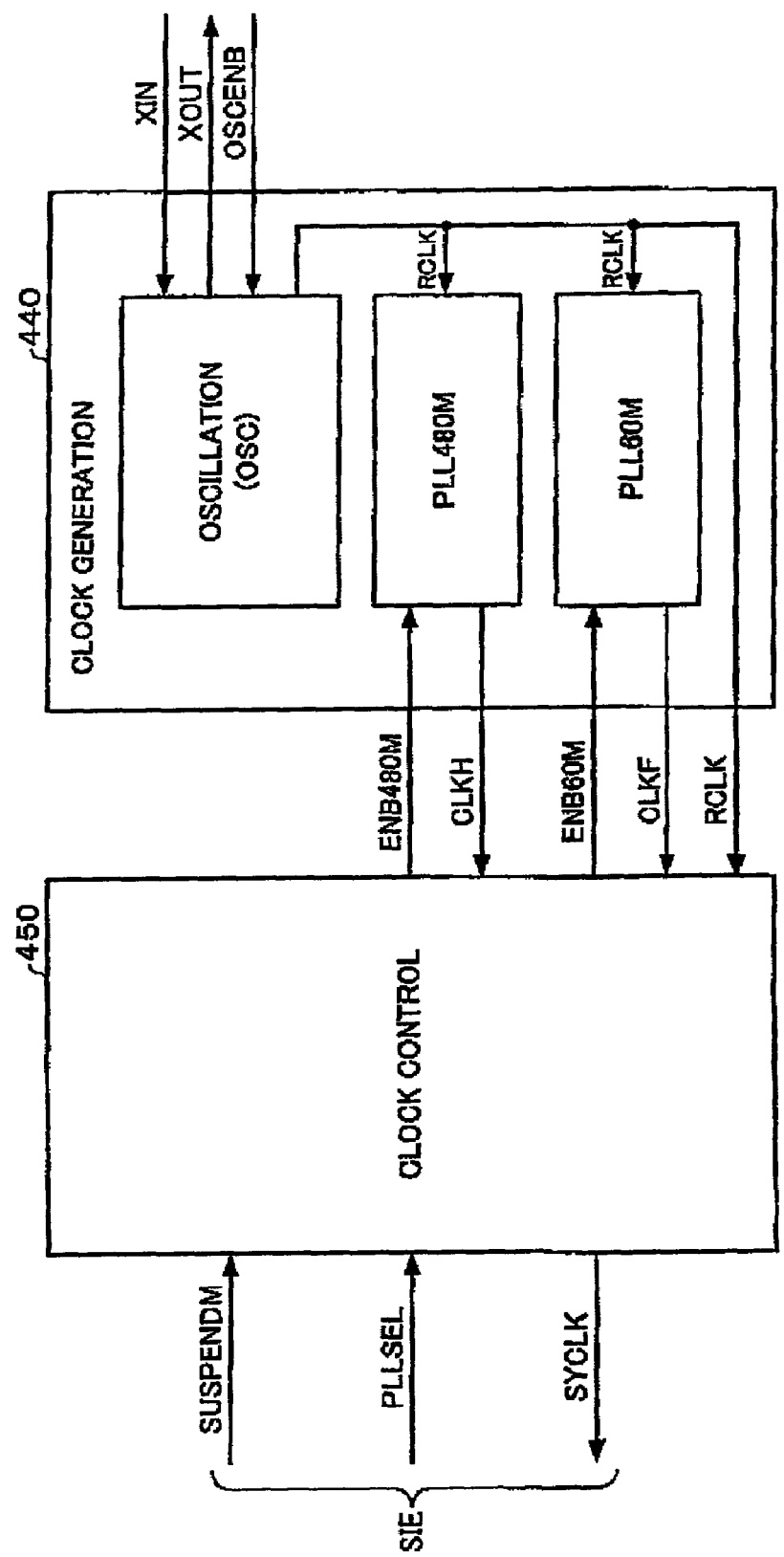
FIG. 2 shows an example of the configuration of the clock generation circuit and the clock control circuit.

An example of the configuration of the clock generation circuit 440 (clock generation means) and the clock control circuit 450 (clock control means) in accordance with this embodiment is shown in FIG. 2.

The oscillation circuit (OSC) comprised within the clock generation circuit 440 uses an external oscillator connected to XIN and XOUT to oscillate, generating a base clock RCLK (of, for example, 12 to 24 MHz). This base clock RCLK is output to the PLL480M, the PLL60M, and the clock control circuit 450.

Note that it is also possible to use an external clock that is input to XIN directly as the base clock.

OSCENB is a signal for validating/invalidating the oscillation of OSC and the input of the external clock from XI. If OSCENB becomes "0" (logic level, hereinafter the same), by way of example, the OSC oscillation and the input of the external clock are invalidated; if it becomes "1", they are validated. If OSCENB goes to "0" when the device has been put into a suspended state by SUSPENDM, by way of example, it is possible to transit to a completely suspended state in which even OSC does not operate.

The PLL480M comprised by the clock generation circuit 440 generates a 480-MHz clock that is phase-synchronized with the base clock RCLK, when the condition is satisfied that a ENB480M from the clock control circuit 450 is "1". A 60-MHz clock obtained by dividing this 480-MHz clock is output as CLKH to the clock control circuit 450. Note that the division of the 480-MHz clock could also be done on the clock control circuit 450 side.

The PLL60M comprised by the clock generation circuit 440 generates a 60-MHz clock that is phase-synchronized with the base clock RCLK, when the condition is satisfied that a ENB60M signal from the clock control circuit 450 is "1". This 60-MHz is output to the clock control circuit 450 as CLKF.

The clock control circuit 450 receives the SUSPENDM and PLLSEL signals from the serial interface engine (SIE) and controls the clock generation operation by the clock generation circuit 440 (autonomous operation of the PLL480M and the PLL60M). It also generates and outputs a system clock SYCLK (reference clock for synchronization) used within the data transfer control device and by the SIE (later-stage data processing means), based on the clocks CLKH and CLKF generated by the clock generation circuit 440.

Note that is a signal for suspending the data transfer control device (transceiver macro). If the transfer control device is suspended by making SUSPENDM go to "0", all circuits other than the oscillation circuit (OSC) halt.

In addition, PLLSEL is a signal that enables the SIE to select which of the PLL480M and the PLL60M is to operate autonomously; when PLLSEL is "0" the PLL480M is selected and when it is "1" the PLL60M is selected. Note that it is necessary to make PLLSEL go to "0" select the PLL480M, when transferring a "chirp" in HS mode.

1.3 operation

Figure 3:
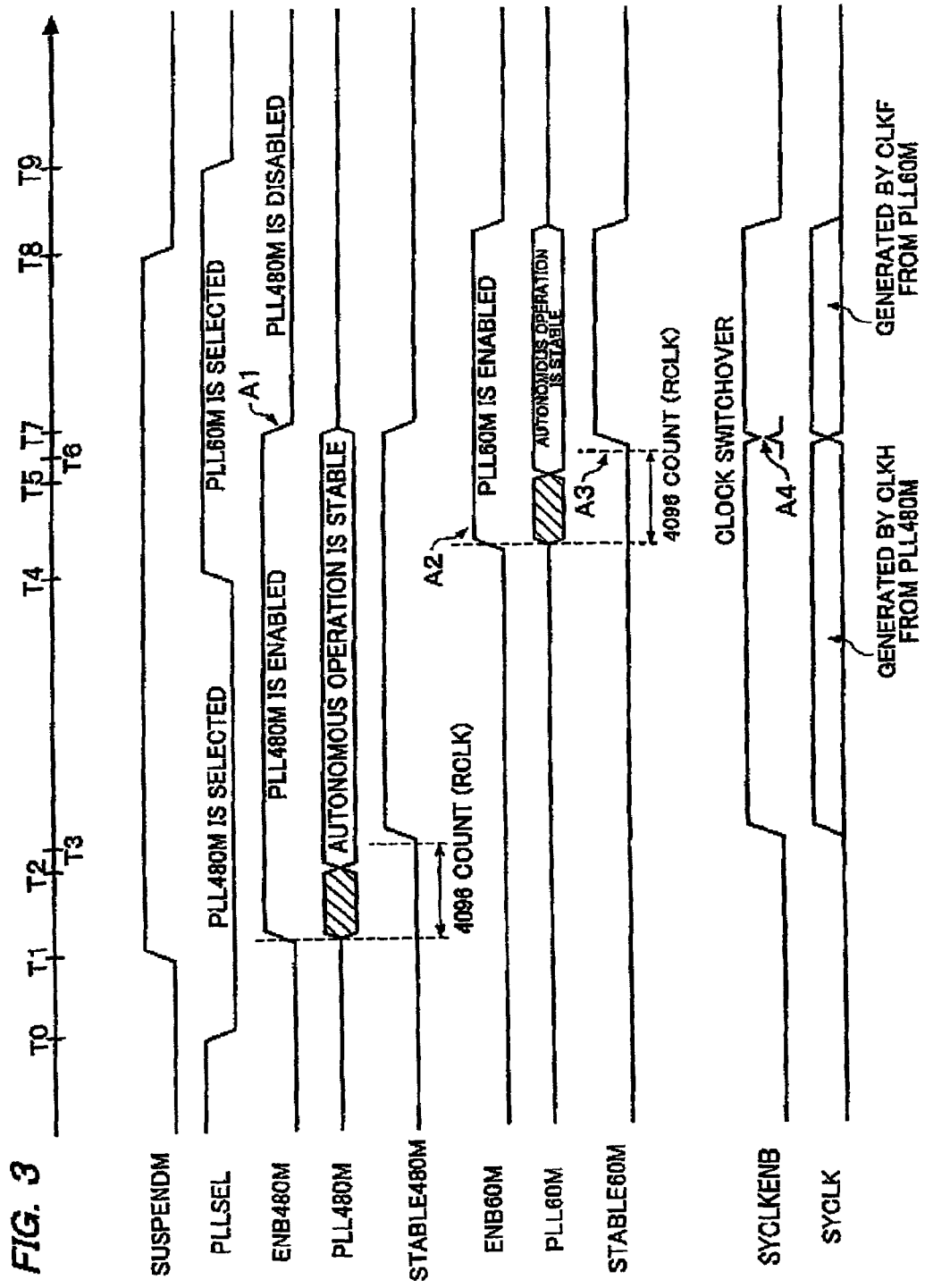
FIG. 3 is a timing waveform chart illustrating the operation of this embodiment.

The description now turns to the operation of this embodiment of the present invention, using the timing waveform chart shown in FIG. 3.

When PLLSEL goes to "0" at a time T0 in FIG. 3, the PLL480M that generates the 480-MHz clock is selected. When suspension is released at a time T1 by making SUSPENDM go to "1", ENB480M goes to "1", enabling the autonomous operation (clock generation operation) of the PLL480M.

A count based on the base clock RCLK from the OSC (or a clock divided from RCLK) starts, and STABLE480M goes to "1" when that count ends at a time T3. In other words, STABLE480M goes to "1" at a time at which it is assumed that the autonomous operation of the PLL480M has stabilized (at a time at which it is assumed that the 480 MHz±500 ppm clock required for the USB 2.0 standard is being generated).

When that happens, the configuration is such that a SYCLKENB signal (SYCLK mask signal) goes to "1" and the system clock SYCLK (a 60-MHz clock) generated by CLKH (the 60-MHz clock divided from 480 MHz) from the PLL480M is supplied to the interior of the data transfer control device and the SIE (later-stage data processing means).

Note that a count based on the base clock RCLK from the oscillation circuit OSC is performed in order to measure the period between T1 and T3 in FIG. 3 (the period required for the autonomous operation of the PLL480M to stabilize). This RCLK becomes a stable clock after the OSCENB of FIG. 2 has gone to "1" and the oscillation of the oscillation circuit OSC has stabilized. Use of this RCLK therefore makes it possible to measure the period from T1 to T3 stably.

When PLLSEL goes to "1" at a time T4, the PLL60M that generates the 60-MHz clock is selected and also ENB60M goes to "1", enabling the autonomous operation (clock generation operation) of the PLL60M.

A count based on the base clock RCLK starts, and STABLE60M (a signal indicating that the autonomous operation of the PLL60M has stabilized) goes to "1" when that count ends at a time T6, causing a switch in clocks by using SYCLKENB, which is the system clock SYCLK mask signal. More specifically, the system clock SYCLK supplied to the interior of the data transfer control device and the SIE is based on CLKH from the PLL480M before the clocks are switched, whereas it is based on CLKF from the PLL60M after the switch.

With this embodiment of the invention, the autonomous operation of the PLL60M is enabled (started), as shown at A2 in FIG. 3, before the autonomous operation (clock generation operation) of the PLL480M is disabled (ended), as shown at A1. The clock used for the generation of the system clock SYCLK is switched from CLKH (the PLL480M) to CLKF (the PLL60M), as shown at A4, after it is determined that the autonomous operation of the PLL60M has stabilized, as shown at A3.

This makes it possible to ensure that the clock CLKF from the PLL60M is being output in a stable manner (see A3) when the clocks are switched, as shown at A4 in FIG. 3. The clock that is the source for the generation of the system clock SYCLK is switched from the clock CLKH to this stable clock CLKF. It is therefore possible to supply the data transfer control device and the SIE with a system clock SYCLK that is always stable, even when the clocks are switched as shown at A4 in FIG. 3, thus preventing erroneous operation of the data transfer control device and the SIE.

If the clocks (PLLs) are switched in this manner and the autonomous operation of the PLL480M is disabled as shown at A1 in FIG. 3, the PLL480M can be disabled and the PLL60M can subsequently operate alone. It is therefore possible to reduce the power consumption of the PLL480M to close to zero, making is possible to greatly reduce the power consumption of the entire data transfer control device.

In other words, the configuration is such that the PLL480M operates in the faster HS mode so that SYCLK is generated from CLKH from the PLL480M, whereas the operation of the PLL480M is halted in the slower FS mode and SYCLK is generated from CLKF from the PLL60M. There is therefore no need for the PLL480M to operate in FS mode, preventing wasteful power consumption in FS mode and thus enabling a large reduction in power consumption in FS mode.

A configuration could be considered in which only the PLL480M is provided as a clock generation circuit and the system clock SYCLK in FS mode is generated by dividing the clock from the PLL480M, as a comparative example.

With this comparative example, however, the PLL480M operates even in PS mode, wasting power in FS mode and thus making it impossible to reduce the power consumption in PS mode.

In contrast thereto, this embodiment of the invention is configured so that the PLL480M does not operate in FS mode, leaving the less power-intensive PLL60M to operate alone, making it possible to greatly reduce the power consumption in Ps mode in comparison with the above-described comparative example.

1.4 Masking of System Clock During Clock Switchover

Figure 4:
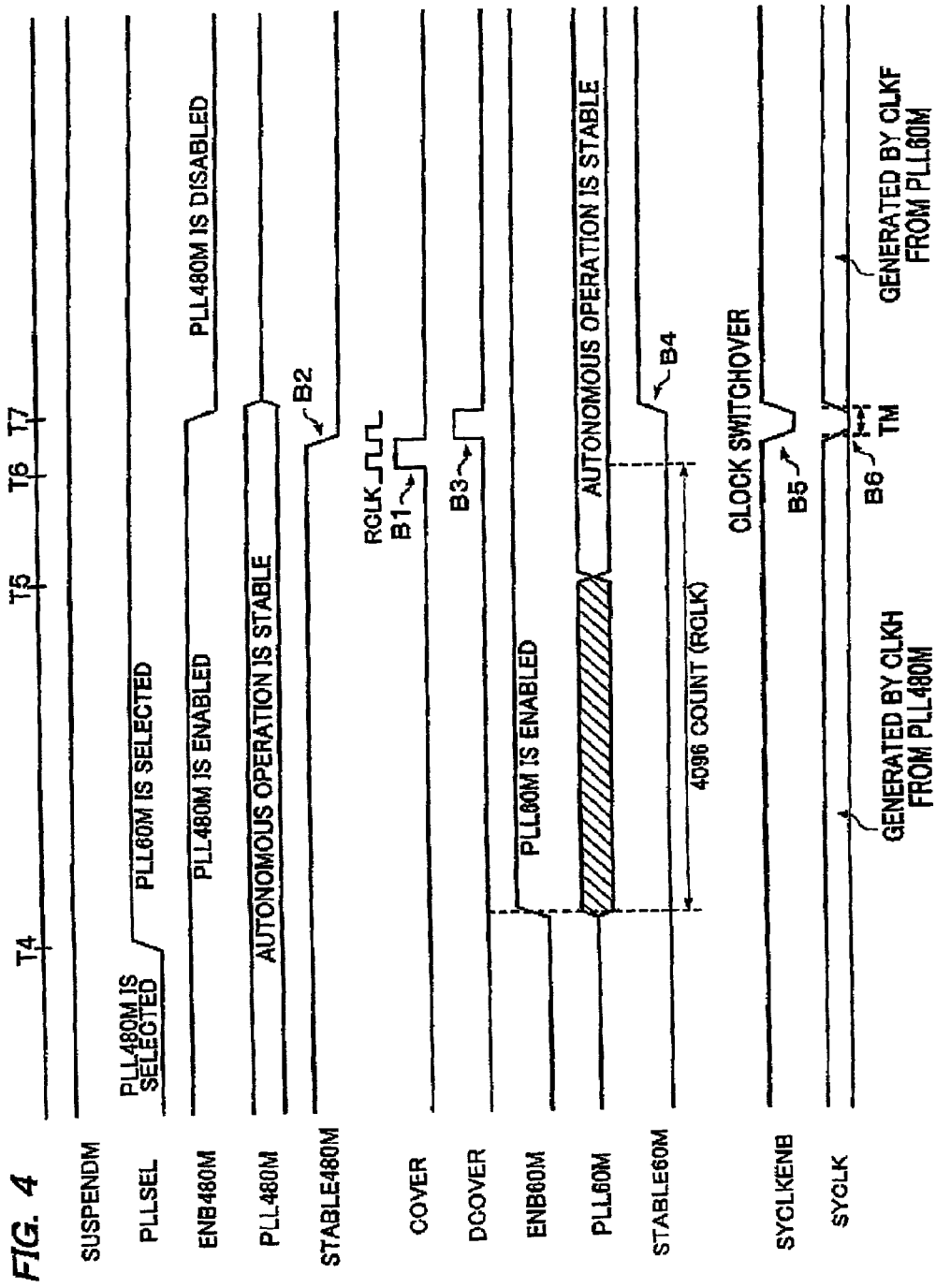
FIG. 4 is a timing waveform chart further illustrating the operation of this embodiment.
Figure 5:
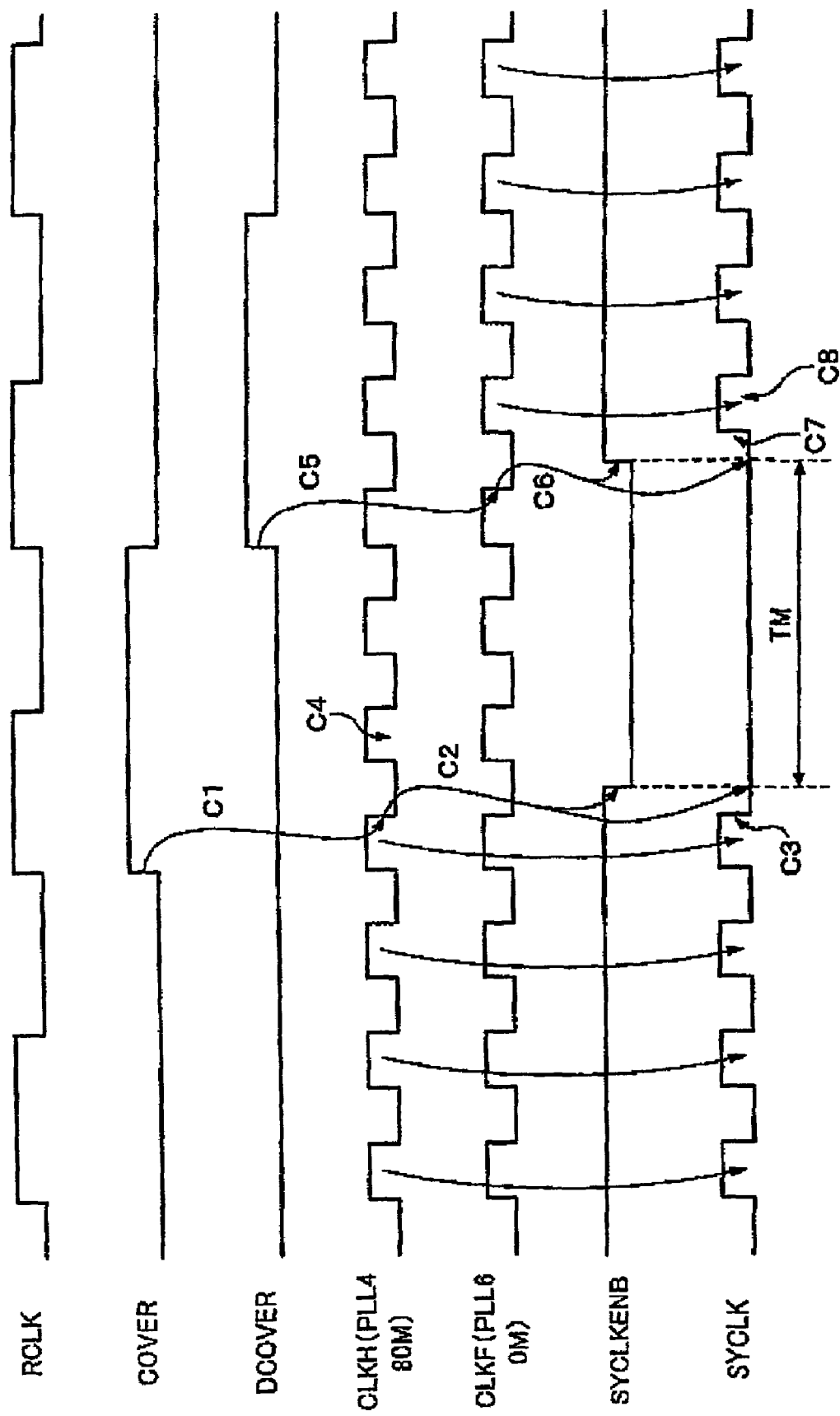
FIG. 5 is a timing waveform chart still further illustrating the operation of this embodiment.

Timing waveform charts shown in FIGS. 4 and 5 illustrate the operation of this embodiment of the invention during the clock switchover (times T4 to T7 in FIG. 3).

When PLLSEL goes to "1" at time T4 in FIG. 4, ENB60M goes to "1" and the autonomous operation of the PLL60M is enabled. The autonomous operation of the PLL60M goes from an unstable state (shaded portion) to a stable state at a time T5 and a count based on the base clock RCLK ends at a time T6, whereupon a count-over signal COVER goes to "1" at the rising edge of RCLK, as shown at B1 in FIG. 4. This changes the STABLE480M signal from "1" to "0", as shown at B2.

A DCOVER signal goes to "1" at the next rising edge of RCLK, as shown at B3 in FIG. 4. This changes the STABLE60M signal from "0" to "1", as shown at B4.

The SYCLKENB signal is generated to go to "0" (a first level) in a clock switchover period, as shown at B5 in FIG. 4, by performing a logical OR on these STABLE480M and STABLE60M signals, by way of example. The configuration is such that SYCLK is held at "0" (a first level, which could also be "1"), as shown at B6, by using the SYCLKENB signal to mask the system clock SYCLK (by ANDing SYCLKENB and SYCLK).

In the thus-configured embodiment, the system clock SYCLK is set to "0" during a period TM in which the clock used for generating SYCLK is being switched from CLKH (the PLL480M) to CLKF (the PLL60M). This therefore ensures that a clock that has been made unstable by the switchover from CLKH to CLKF is not supplied as SYCLK to the data transfer control device and SIE (later-stage data processing means). This makes it possible to cope in a flexible manner, even if there's a difference in phase between CLKH and CLKF. As a result, it is possible to effectively prevent situations in which the data transfer control device or the SIE operate erroneously due to causes such an glitches (tiny whisker-like spikes) generated in SYCLK.

Note that the setting of the period TM during with the system clock SYCLK is set to "0" is based on the base clock RCLK (of, for example, 12 to 24 MHz) used in clock generation by the PLL480M and the PLL60M. In other words, the period TM is the space between the edges of RCLK (the length of one clock pulse of RCLK) shown at B1 and B3 in FIG. 4. It is therefore possible to base the setting of the length of the clock switchover period TM on the base clock RCLK that is in a stable signal state even during the switchover. At clock switchover, CLKH and CLKF can be masked reliably by using the signal SYCLKENB.

1.5 Glitch Prevention

The description now turns to the method used to prevent the generation of glitches reliably at clock switchover.

When the count-over signal COVER goes to "1", the system detects CLKH from the PLL480M reaches MOS (waits until it reaches "0"), as shown at C1 in FIG. 5. The mask signal SYCLKENB is set to "0" when the condition is satisfied that CLKH has reached "0" (a first level, or at the falling edge of CLKH) and the system clock SYCLK, which is generated from an AND of SYCLKENB and CLKH, is fixed at the "0" level, as shown at C2 in FIG. 5.

This makes it possible to fix the level of the system clock SYCLK at "0" after SYCLK has changed from "1" to "0", as shown at C3 in FIG. 5, before it can change back from "0" to "1". In other words, the clock pulse of CLKH shown at C4 masks the "0" level of SYCLKENB, enabling reliable prevention of the generation of "1"-level glitches in SYCLK.

When the DCOVER signal, which is delayed by one clock pulse of RCLK from the count-over signal COVER, goes to "1" as shown at C5 in FIG. 5, the system detects CLKF from the PLL60M reaches "0" (waits until it reaches "0"). The mask signal SYCLKENB is set to "1" when the condition is satisfied that CLKF has reached "0" (the first level) and the system clock SYCLK, which is generated from an AND of SYCLKENB and CLKF, is set to the "1" level, as shown at C6 in FIG. 5.

This makes it possible to release the mask set by setting the SYCLKENB signal to "0", thus enabling the output of CLKF as SYCLK before the system clock SYCLK changes from "0" to "1", as shown at C7 in FIG. 5. It is therefore possible to reliably prevent a situation in which tiny glitches are generated in the clock pulses of SYCLK, as shown at C8.

This enables reliable prevention of the generation of glitches during the clock switchover period TM. It is therefore possible to prevent a situation in when data is held erroneously by the D flip-flops comprised within the data transfer control device or SIE, which would be caused by such glitches, ensuring stable operation of the device.

Note that the description above related to an example of timing waveforms that occur during a switch of clocks from CLKH (the PLL480M) to CLKF (the PLL60M), as shown in FIGS. 3 to 5, but the clock switchover from CLKF (the PLL60M) to CLKH (the PLL480M) can also be implemented in a similar manner to the timing waveforms shown in FIGS. 3 to 5.

1.6 Detailed Operation of Clock Control Circuit

Figure 6:
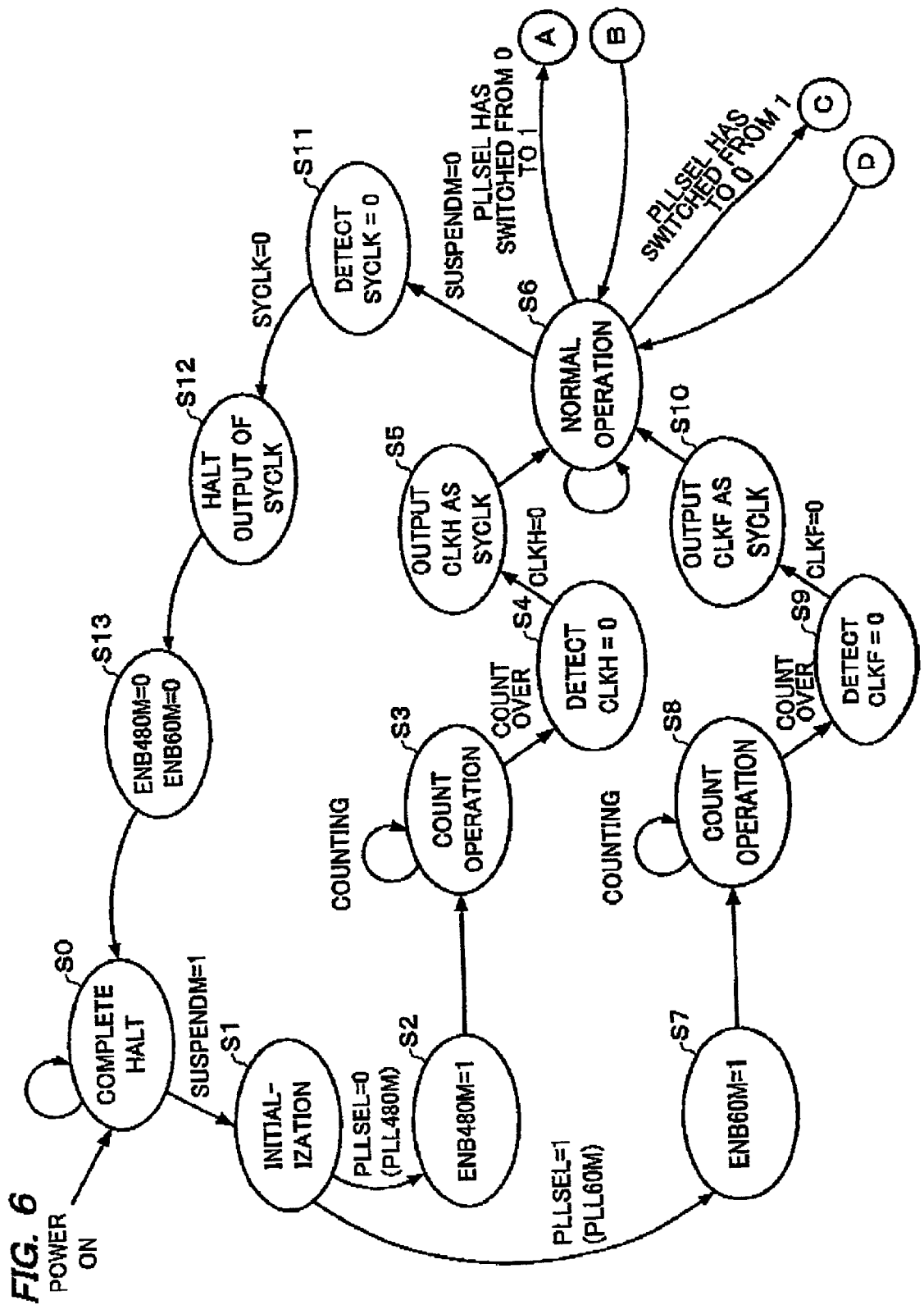
FIG. 6 is a state transition diagram illustrating the operation of the clock control circuit.
Figure 7:
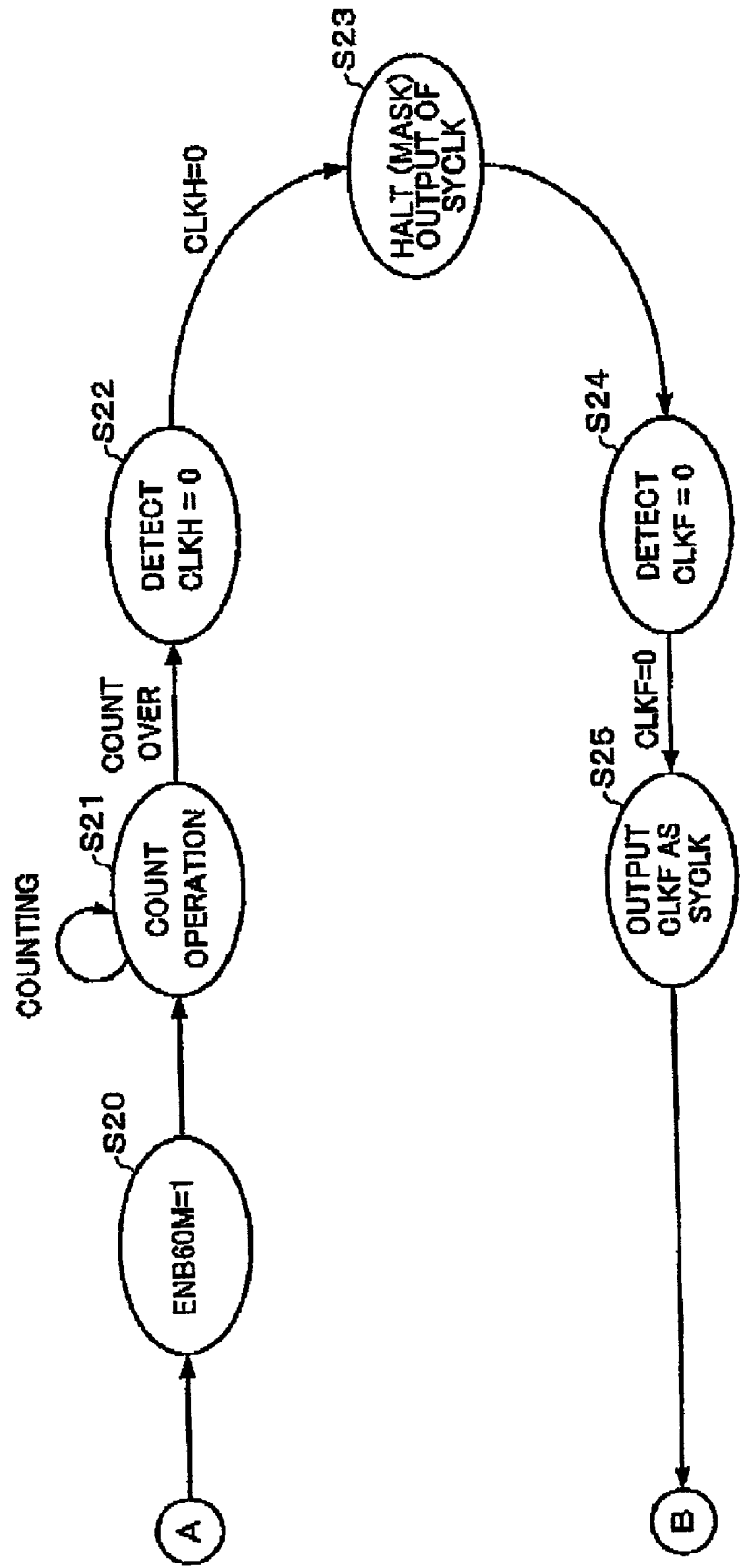
FIG. 7 is a state transition diagram further illustrating the operation of the clock control circuit.
Figure 8:
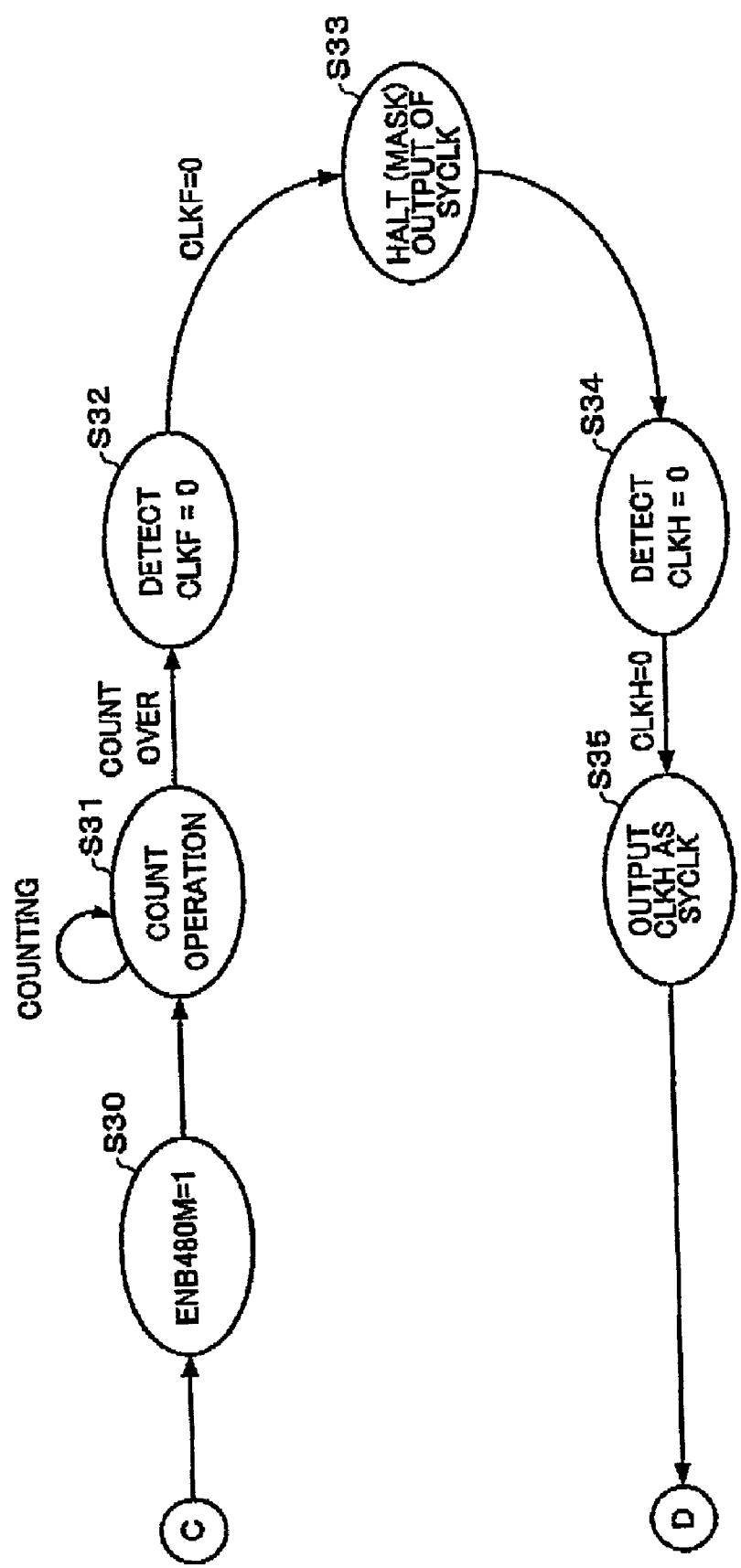
FIG. 8 is a state transition diagram still further illustrating the operation of the clock control circuit.

State transition diagrams shown in FIGS. 6 to 8 will now be used to illustrate details of the operation of the clock control circuit 450 of FIG. 2.

When the SUSPENDM goes to "1" after power is applied to the device, which is on standby in a completely halted state (state S0), initialization processing is performed (state S1), when the PLLSEL signal becomes "0", the ENB480M signal goes to "1" (state S2, or T1 in FIG. 3), enabling the autonomous operation of the PLL480M.

The count operation of the base clock RCLK then starts (state S3), then the system detects the clock CLKH from the PLL480M becoming "0" (state S4). The clock CLKH is output as the system clock SYCLK when the condition is satisfied that CLKH has become "0" (state S5), and the system changes to the normal operating state S6. If CLKF is output as SYCLK only on condition that CLKH has become "0" in this manner, it is possible to efficiently prevent the generation of glitches in SYCLK If the PLLSEL goes to "1" in the state S1, on the other hand, the ENB60M signal goes to "1" (state S7), enabling the autonomous operation of the PLL60M.

The count operation of the base clock RCLK then starts (state S8) and the system detects the clock CLKF from the PLL60M becoming "0" after the count ends (state S9). The CLKF clock is output as SYCLK when the condition is satisfied that CLKF has become "0" (state S10), and the system changes to the normal operating state S6.

If the SUSPENDM signal goes to "0" in the normal operating state S6, the system detects the system clock SYCLK becoming "0" (state S11). When SYCLK becomes "0", the output of SYCLK is halted (state S12), the ENB480M and ENB60M signals are set to "0" (state S13), and the system transitions to the completely halted state S0.

If the PLLSEL signal switches from "0" to "1" in the normal operating state S6, the ENB60M signal is set to "1" (state S20 in FIG. 7). When that happens, the count operation of the base clock RCLK starts (state S21), then the system detects the clock CLKH from the PLL480M becoming "0" after the count ends (state S22, or C1 in FIG. 5). When CLKH becomes "0", the output of SYCLK is halted by using the mask signal SYCLKENB (state S23, or C2 in FIG. 5).

The system then detects the clock CLKF from the PLL60M becoming "0" (state S24, or C5 in FIG. 5). When CLKP becomes "0", the SYCLKENB signal is set to "1" (C6 in FIG. 5), CLKF is output as the system clock SYCLK (state S25), and the system transitions to the normal operating state S6, as shown in FIG. 6.

The clock switchover illustrated by states S22 to S25 in FIG. 7 makes it possible to efficiently prevent the generation of glitches in the system clock SYCLK during the switchover from CLKH to CLKF.

If the PLLSEL is switched from "1" to "0" during the normal operating state S6 of FIG. 6, on the other hand, the ENB480M signal is set to "1" (state S30 in FIG. 8). When this happens, the count operation of the base clock RCLK starts (state S31), then the system detects the clock CLKF from the PLL60M becoming "0" after the count ends (state S32). When CLKF becomes to "0", the output of SYCLK is halted by using the mask signal SYCLKENB (state S33).

The system then detects the clock CLKH from the PLL480M becoming "0" (state S34). When CLKH becomes "0", the SYCLKENB signal is set to "1", CLKH is output as the system clock SYCLK (state S35), and the system transitions to the normal operating state S6, as shown in FIG. 6.

The clock switchover illustrated by states S32 to S35 in FIG. 8 makes it possible to efficiently prevent the generation of glitches in the system clock SYCLK during the switchover from CLKF to CLKH.

1.7 Detailed Examples of PLL480M and PLL60M

Figure 9:
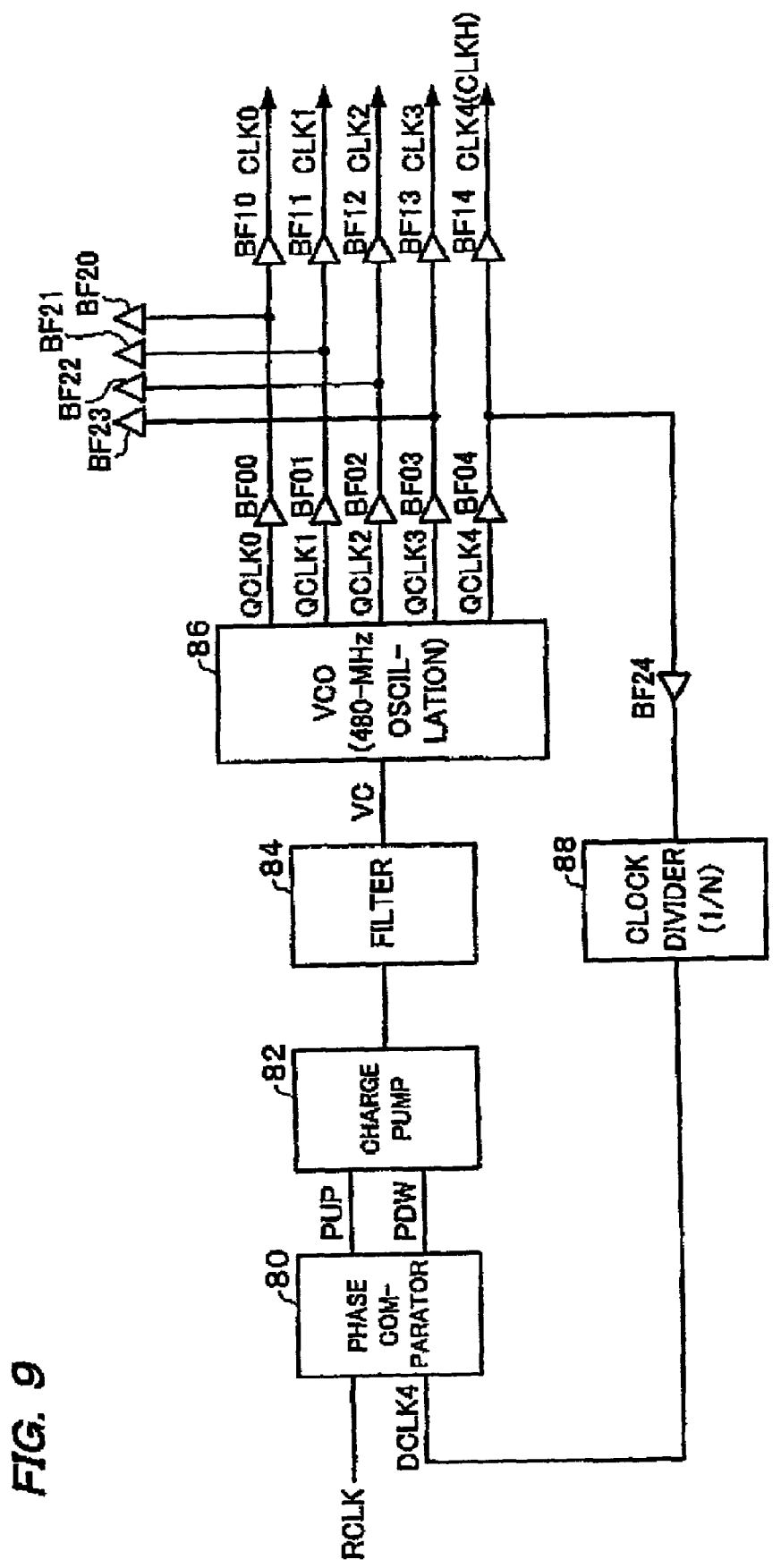
FIG. 9 shows an example of the configuration of the PLL480M.

A detailed example of the configuration of the PLL480M is shown in FIG. 9.

This PLL480M comprises a phase comparator 80, a charge pump circuit 82, a filter circuit 84, a voltage-controlled oscillator (VCO) 86, and a clock divider 88.

In this case, the phase comparator 80 compares the phases of the base clock RCLK (of, for example, 12 to 24 MHz) and a clock DCLK4 from the clock divider 88, then outputs a phase error signal PUP or PDW (where PUP is a phase-advanced signal and PDW is a phase-retarded signal).

The charge pump circuit 82 operates as a charge pump on the basis of the PUP or FDW signal from the phase comparator 80. More specifically, if PUP is active, the charge pump circuit 82 charges a capacitor within the filter circuit 84; if PDW is active, it discharges the capacitor. A control voltage VC that has been smoothed by the filter circuit 84 is given to the VCO 86.

The VCO 86 performs an oscillation operation wherein the oscillation frequency is controlled in a variable manner in accordance with the control voltage VC, to generate 480-MHz clocks QCLK0 to QCLK4. If the control voltage VC is high, by way of example, the oscillation frequency also increases; if the control voltage VC is low, the oscillation frequency also decreases.

The clocks QCLK0 to QCLK4 generated by the VCO 86 are output to the exterior as CLK0 to CLK4 through buffers BF00 to BF04 and BF10 to SF14. Note that BF20 to BF23 denote dummy buffer circuits for load-combining with another buffer circuit BF24.

The clock divider 88 takes the clock QCLK4 that is input from the VCO 86 through the buffer circuits BF04 and BF24, divides it (1/N), and outputs the result of the division as the clock DCLK4 to the phase comparator 80.

Use of the PLL480M configured as shown in FIG. 9 makes it possible to generate a high-frequency 480-MHz clock CLK4 that is phase-synchronized with the base clock RCLK. Note that the thus generated clock CLK4 is divided by a clock divider (not shown in the figure) for output to the clock control circuit 450 of FIG. 2 as the 60-MHz CLKH.

Figure 10:
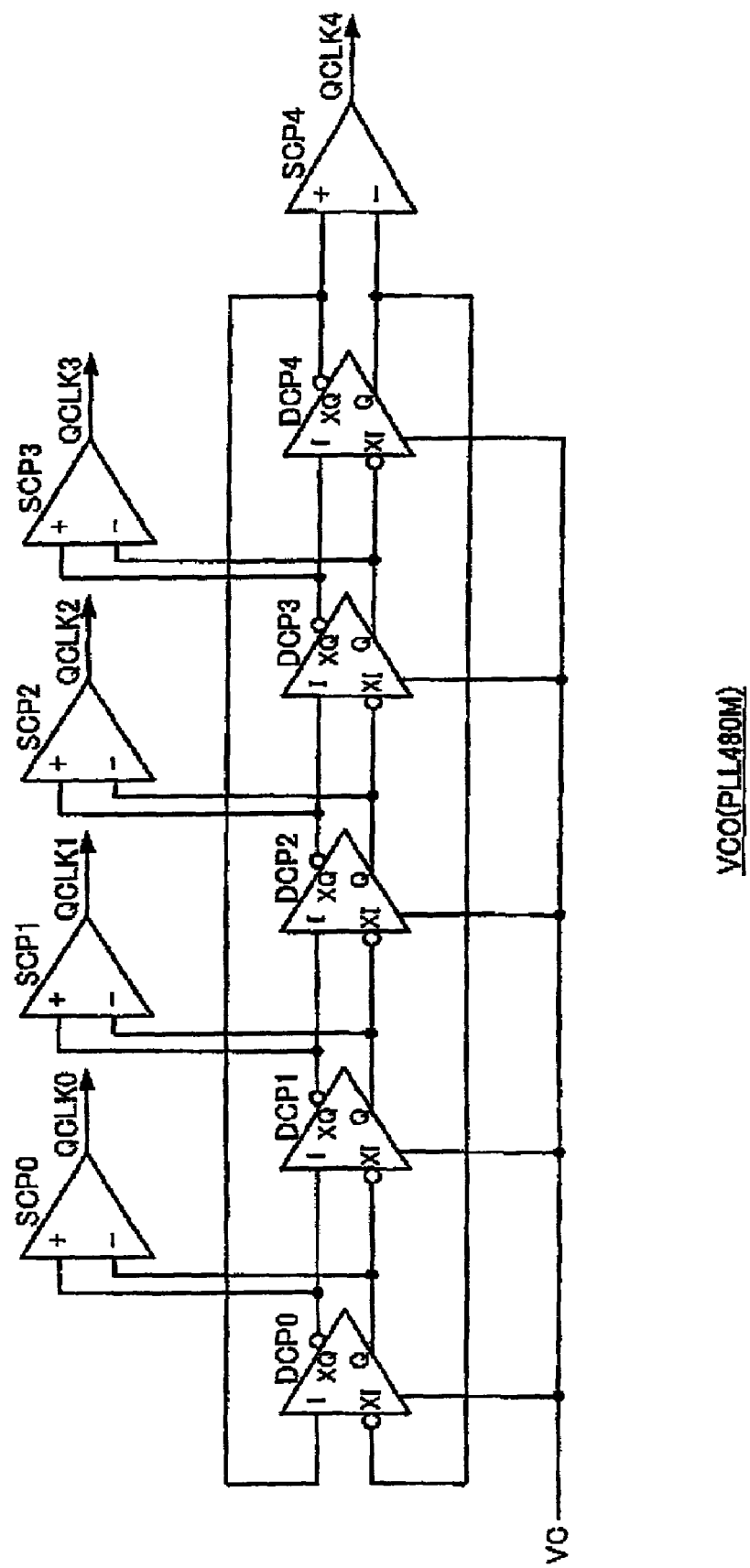
FIG. 10 shows an example of the configuration of the VCO comprised within the PLL480M.

An example of the configuration of the VCO 86 of FIG. 9 is shown in FIG. 10.

This VCO 86 comprises five stages (generally speaking: an odd number of stages) of serially-connected differential output conparators DCP0 to DCP4 (inversion circuits), such that differential outputs Q and XQ of each of DCP0 to DCP4 are input to differential inputs of single-end output comparators SCP0 to SCP4. Outputs of SCP0 to SCP4 become the output clocks QCLK0 to QCLK4 of the VCO 86. If the control voltage VC changes, the current flowing through the current source of the differential output comparators DCP0 to DCP4 also changes, so the oscillation frequency changes.

Figure 11:
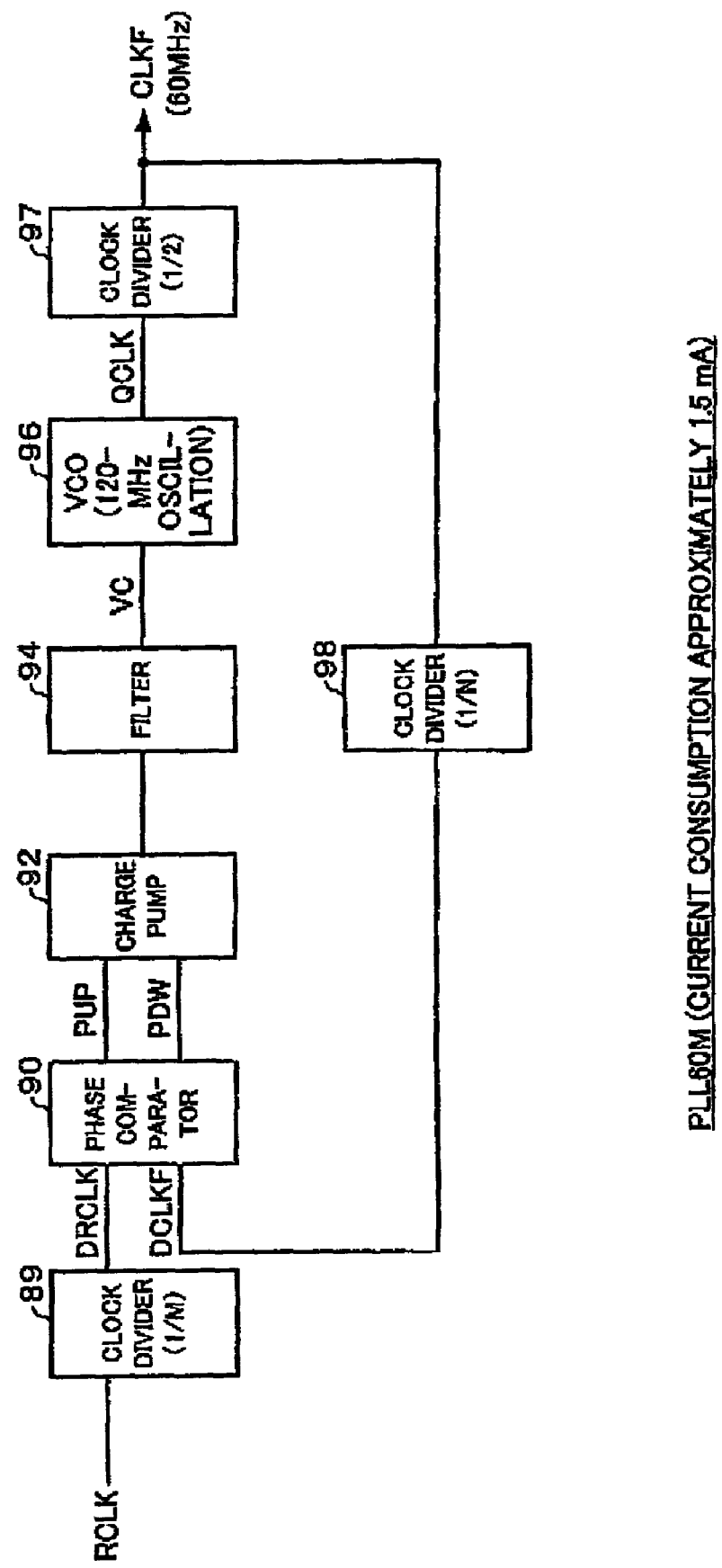
FIG. 11 shows an example of the configuration of the PLL60M.

A detailed example of the configuration of the PLL60M is shown in FIG. 11.

This PLL60M comprises a clock divider 89, a phase comparator 90, a charge pump circuit 92, a filter circuit 94, a VCO 96, and clock dividers 97 and 98.

In this case, the phase comparator 90 compares the phases of a clock DRCLK from the clock divider 89 (a clock which is divided from the base clock RCLK) and a clock DCLKF from the clock divider 98, and outputs the phase error signal PUP or PDW.

The charge pump circuit 92 operates as a charge pump on the basis of the PUP or PDW signal from the phase comparator 90. More specifically, if PUP is active, the charge pump circuit 92 charges a capacitor within the filter circuit 94; if PDW is active, it discharges the capacitor. A control voltage VC that has been smoothed by the filter circuit 94 is given to the VCO 96.

The VCO 96 performs an oscillation operation wherein the oscillation frequency is controlled in a variable manner in accordance with the control voltage VC, to generate a 120-MHz clock QCLK.

The clock divider 97 divides the clock QCLK that is input from the VCO 96 (1/2) and outputs the thus-divided 60-MHz clock CLKP to the clock control circuit 450 of FIG. 2.

The clock divider 98 divides a clock QCLKF that is input from the clock divider 97 (1/N) and outputs the thus-divided clock DCLKF to the phase comparator 90.

Use of the PLL60M configured as shown in FIG. 11 makes it possible to generate the 60-MHz clock CLKP, which is phase-synchronized with the base clock RCLK, and output it to the clock control circuit 450 of FIG. 2.

Figure 12:
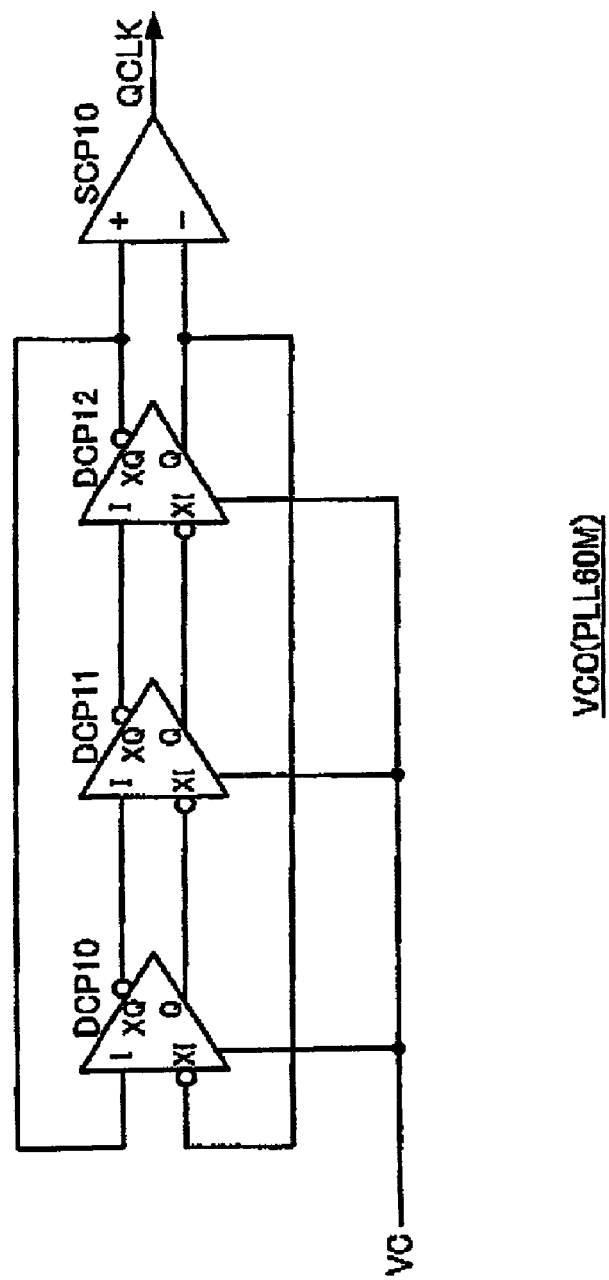
FIG. 12 shows an example of the configuration of the VCO comprised within the PLL60M.

An example of the configuration of the VCO 96 of FIG. 11 is shown in FIG. 12.

This VCO 96 comprises three stages of serially connected differential output comparators DCP10 to DCP12 (inversion circuits). Differential outputs XQ and Q of the final-stage differential output comparator DCP12 are input to differential inputs of a single-end output comparator SCP10, and the output of SCP10 becomes the output clock QCLK of the VCO 96. If the control voltage VC changes, the current flowing through the current source of the differential output comparators DCP10 to DCP12 also changes, changing the oscillation frequency.

Figure 13A:
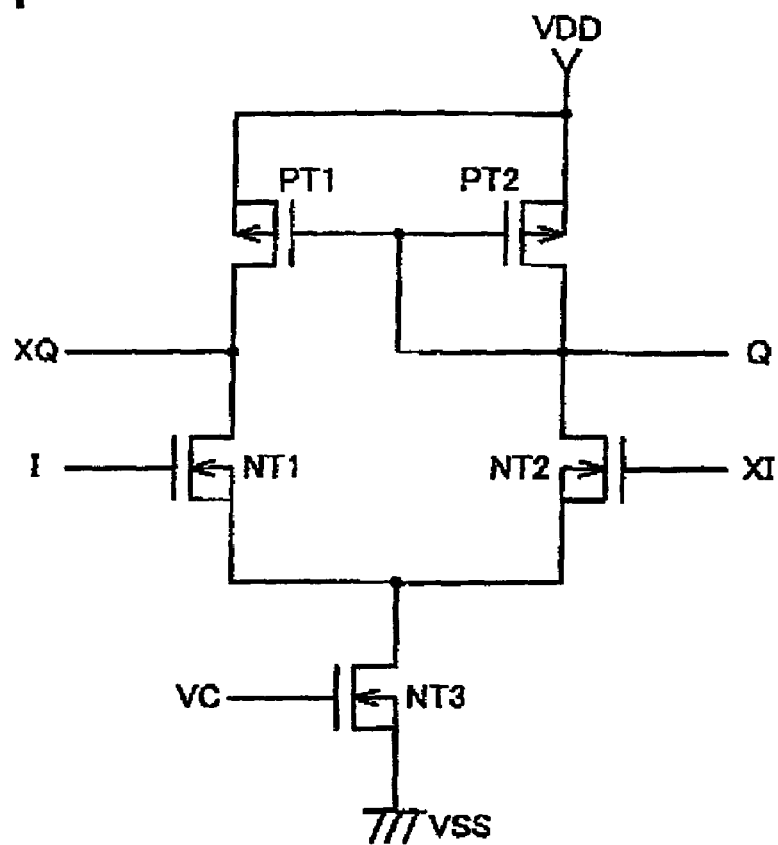
FIGS. 13A and 13B shows examples of the configuration of the inversion circuit.

An example of the configuration of the differential output comparator (differential amplifier) comprised within the VCO of FIGS. 10 and 12 is shown in FIG. 13A. This differential output comparator comprises transistors NT1 and NT2, where differential inputs I and XI are connected to the gate electrodes thereof and differential outputs XQ and Q are connected to the drain electrodes thereof; p-type transistors PT1 and PT2, where the differential output Q is connected to both gate electrodes thereof and the differential outputs XQ and Q are connected to the drain electrodes thereof; and an n-type transistor NT3 (current source), where the control voltage VC is connected to the gate electrode thereof.

The VCO 96 (120-MHz oscillation) of FIG. 12 can be optimized for use with 120 MHz (or 60 MHz) oscillation by selecting factors such as the sizes of the transistors comprised within the differential output comparators DCP10 to DCP12 and the single-end output comparator SCP10. It is therefore possible to greatly reduce the power consumption of the VCO 96 of FIG. 12 in comparison with that of the VCO 86 (480-MHz oscillation) of FIG. 10. For that reason, the current consumption of the PLL60M comprised within the VCO 96 of FIG. 12 becomes extremely small, approximately 1.5 mA, in contrast to the extremely high current consumption of the PLL480M comprised within the VCO 86 of FIG. 10, which is approximately 33 mA, by way of example.

In HS mode, therefore, the clock is generated by using the PLL480M, but if the operation of the PLL480M is halted and the PLL60M alone is used to generate the clock in PS mode, it becomes possible to reduce the current consumed by the PLL to approximately ½₂, by way of example, making it possible to reduce the power consumption of the data transfer control device.

Note that the PLL480M and PLL60M of FIGS. 9 and 11 could also be configured to not have the charge pump circuits 82 and 92. In addition, current-controlled oscillation means could be provided instead of the VCOs 86 and 96.

Figure 13B:
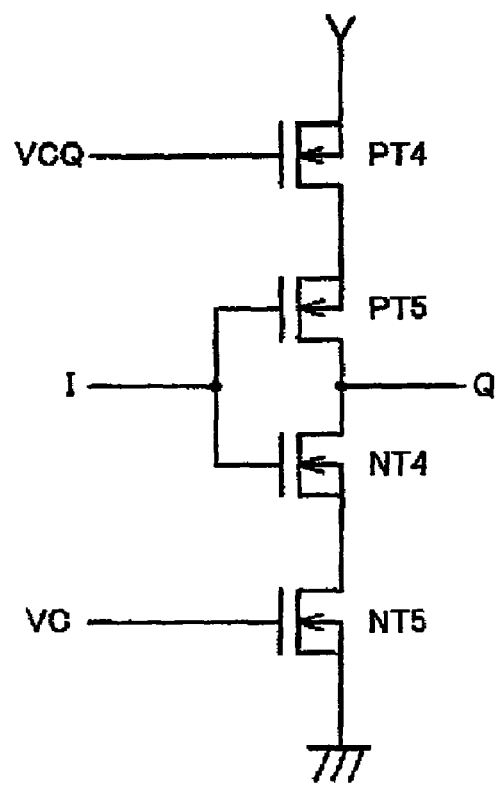

In addition, the inversions circuits comprised within the VCOs 86 and 96 are not limited to differential output comparators and thus various modifications are possible. For example, p-type transistors PT4 and PT5 and n-type transistors NT4 and NT5 could be connected in series to form the inversion circuit shown in FIG. 13B. The current flowing in these transistors is controlled by control voltages VCQ and VC connected to the gate electrodes of PT4 and NT5, providing variable control of the oscillation frequency.

1.8 Clock Switchover Timing

The description now turns to the optimal timing for switching clocks under USB 2.0.

A timing waveform chart shown in FIG. 14 relates to an example in which the data transfer control device (electronic equipment) of this embodiment of the invention has been connected to a bus (device attachment).

At device attachment, this data transfer control device starts operating in HS mode. For that reason, the PLLSEL is set to "0" (the PLL480M is selected). Both XCVRSEL (a signal that validates the HS transceiver when at "0" or the PS transceiver when at "1") and TERMSEL (a signal that validates HS termination when at "0" and FS termination when at "1") are set to "0".

If it is determined at a time T0 in FIG. 14 that VBUS is valid, the SIE asserts a RESET signal and also negates the SUSPENDM signal at a time T1. At device attachment, PLLSET is set to "0" and thus the PLL480M is selected, so the autonomous operation of the PLL480M is enabled.

The RESET signal is negated at time T2 and the stabilized clock CLKH from the PLL480M is output at time T3. The system clock SYCLK generated based on this CLKH is supplied to the SIE.

The XCVRSEL and TERMSEL signals go to "1" at time T4, validating the PS transceiver and FS termination. A reset (SE0) is sent from a downstream port at time T5, and HS detection handshake starts.

A timing waveform chart for HS detection handshake that is shown in FIG. 15 relates to an example in which a port that does not support HS mode is connected to this data transfer control device.

The HS detection handshake starts at time T0 in FIG. 15. The XCVRSEL signal goes to "0" at time T1, validating the HS transceiver. The transmission of a chirp (K) starts. Note that bit-stuffing (BS) processing and NRZI processing are disabled during the transmission of this chirp (K) and data staffed with zeros is output.

The transmission of the chirp (K) ends at time T2. If the downstream port supports HS mode, the transmission of the chirp (K) starts at time T3. However, since the chirp cannot be detected at time T4, the data transfer control device of this embodiment of the present invention returns to FS mode at that point and waits for the end of the reset sequence. The reset sequence ends at time T6 and a transition to normal operation in FS mode occurs at time T7.

The transfer mode is defined as FS mode by this time T4. Since there is a reset phase for FS mode between the times T4 and T6, there is no transfer of packets then. As shown in FIG. 15, the SIE sets the PLLSEL signal to "1" at the time T5 between the times T4 and T6, which disables the autonomous operation of the PLL480M and also enables the autonomous operation of the PLL60M. When that happens, a clock switchover occurs as described with reference to FIG. 3, so that the clock used as the generation source of the system clock SYCLK switches from the clock CLKH of the PLL480M to the clock CLKF of the PLL60M.

In this manner, this data transfer control device detects whether or not the port connected to the bus supports HS mode (the first transfer mode) in a state in which operation is based on the clock CLKH from the PLL480M.

If it is detected that the port connected to the bus does not support HS mode, the autonomous operation of the PLL480M is disabled by the PLLSEL signal (selection signal) from the SIE (later-stage data processing means). This ensures that subsequent operation by the data transfer control device and the SIE is based on the clock CLKF from the PLL60M. Since the autonomous operation of the PLL480M has been disabled, it is possible to prevent wasteful consumption of power by this PLL480M, enabling a reduction in the power consumption of the data transfer control device.

Note that it is also possible to consider a case in which the data transfer control device of this embodiment is removed (detached) from the bus in a state in which it is operating in FS mode and subsequently an HS-mode port is attached to the bus, as an example of the switching of the clock from CLKF from the PLL60M to CLKH from the PLL480M.

2. Electronic Equipment

The description now turns to examples of electronic equipment comprising the data transfer control device of this embodiment of the invention.

Figure 16A:
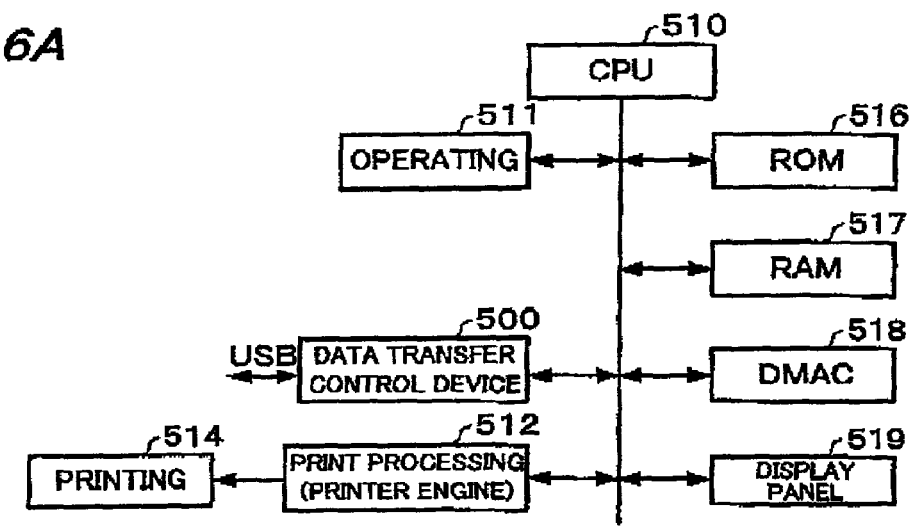
FIGS. 16A, 16B, and 16C are internal block diagrams of various items of electronic equipment.
Figure 17A:
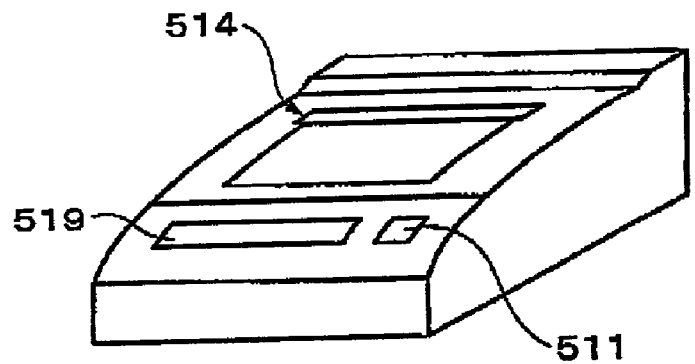
FIGS. 17A, 17B, and 17C show typical external views of various items of electronic equipment.

An internal block diagram of a printer that is one example of such electronic equipment is shown in FIG. 16A with an external view thereof being shown in FIG. 17A. A CPU (microcomputer) 510 has various functions, including that of controlling the entire system. An operating section 511 is designed to enable the user to operate the printer. Data such as a control program and fonts is stored in a ROM 516, and a RAM 517 functions as a work area for the CPU 510. A DMAC 518 is a DMA controller for transferring data through the CPU 510. A display panel 519 is designed to inform the user of the operational state of the printer.

Serial print data that has been send in from another device such as a personal computer via USB is converted into parallel print data by a data transfer control device 500. The thus converted parallel print data is sent to a print processing section (a printer engine) 512 by the CPU 510 or the DMAC 518. This parallel print data is subjected to given processing in the print processing section 512 and is output for printing to paper by a printing section (a device for outputting data) 514 comprising components such as a print head.

Figure 16B:
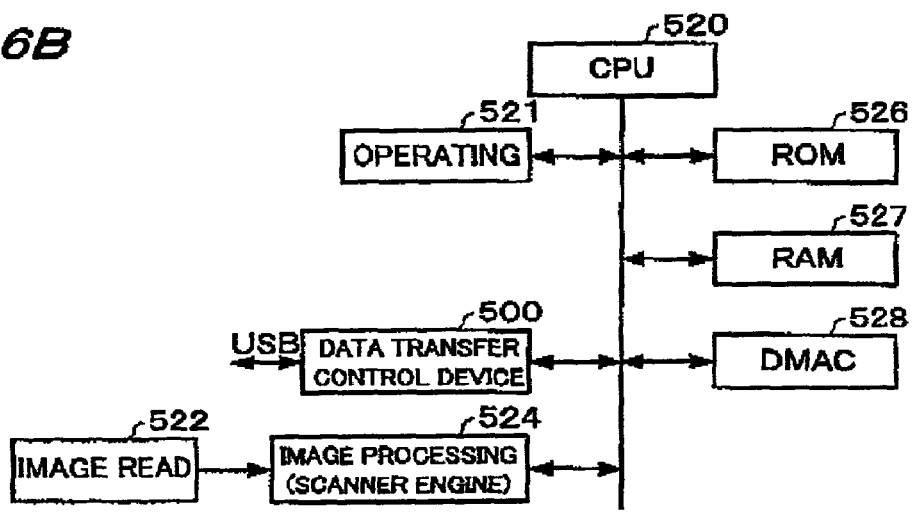
Figure 17B:
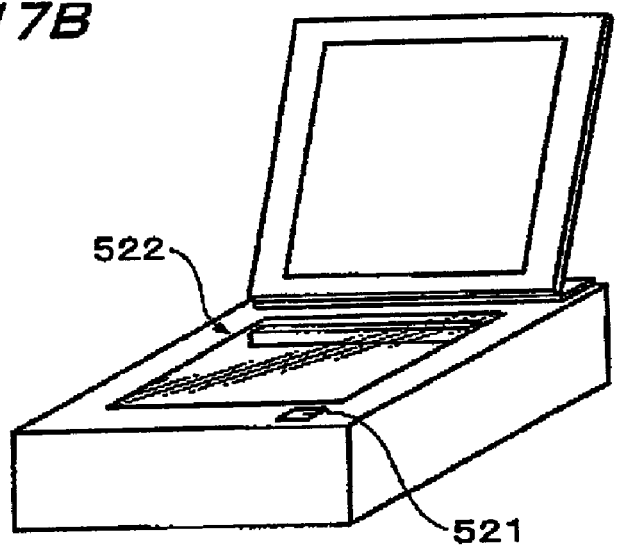

An internal block diagram of a scanner that is another example of electronic equipment is shown in FIG. 16B with an external view thereof being shown in FIG. 17B. A CPU 520 has various functions, including that of controlling the entire system. An operating section 521 is designed to enable the user to operate the scanner. Data such as a control program is stored in a ROM 526, and a RAM 527 functions as a work area for the CPU 520. A DMAC 528 is a DNA controller.

An image of a document is read in by an image read section (a device for fetching data) 522, which comprises components such as a light source and an opto-electric converter, and data of the read-in image is processed by an image processing section (a scanner engine) 524. The processed image data is sent to the data transfer control device 500 by the CPU 520 or DMAC 528. The data transfer control device 500 converts that parallel image data into serial data and sends it to another device such as a personal computer via USB.

Figure 16C:
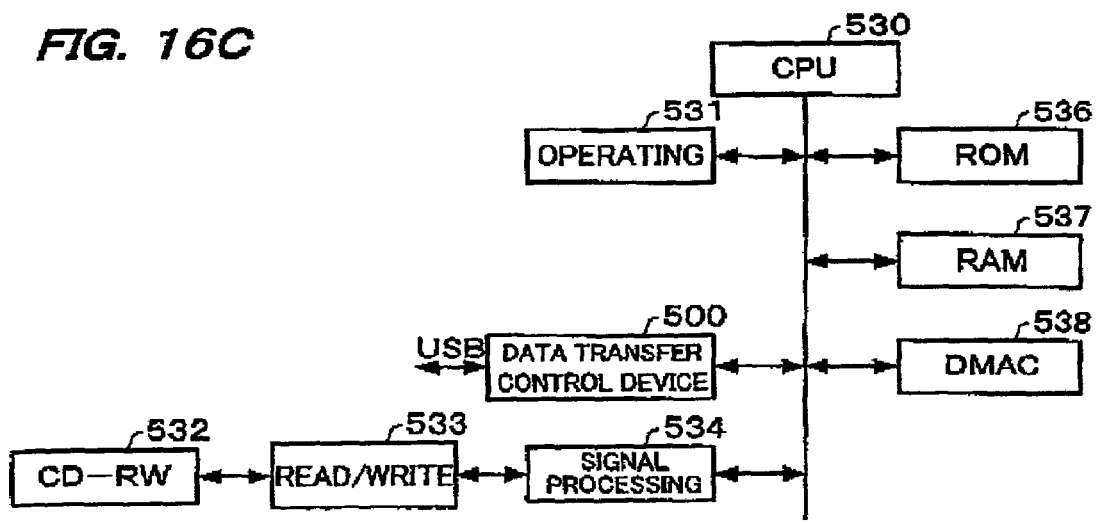
Figure 17C:
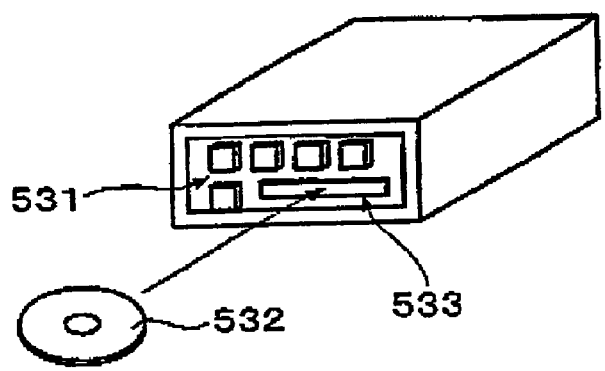

An internal block diagram of a CD-RW drive that is a further example of electronic equipment is shown in FIG. 16C with an external view thereof being shown in FIG. 17C. A CPU 530 has various functions, including that of controlling the entire system. An operating section 531 is designed to enable the user to operate the CD-RW drive. Data such as a control program is stored in a ROM 536, and a RAN 537 functions as a work area for the CPU 530. A DMAC 538 is a DMA controller.

Data read out from a CD-RW 532 by a read/write section (a device for fetching data or a device for storing data) 533, which comprises components such as a laser, a motor, and an optical system, is input to a signal processing section 534 where it is subjected to given signal processing such as error correction. The data that has been subjected to this signal processing is sent to the data transfer control device 500 by the CPU 530 or the DMAC 538. The data transfer control device 500 converts this parallel data into serial data, then sends it to another device such as a personal computer via USB.

Serial data that comes in from another device via USB, on the other hand, is converted into parallel data by the data transfer control device 500. This parallel data is sent to the signal processing section 534 by the CPU 530 or the DMAC 538. This parallel print data is subjected to given signal processing by the signal processing section 534 then is stored by the read/write section 533 on the CD-RW 532.

Note that a separate CPU for controlling data transfer by the data transfer control device 500 could be provided in addition to the CPU 510, 520, or 530 of FIGS. 16A, 16B, and 16C.

Use of the data transfer control device of these embodiments of the present invention in electronic equipment makes it possible to transfer data in the HS mode laid down by USB 2.0. When a user uses a personal computer or the like to specify a printout, it is therefore possible to complete printing with only a small time lag. Similarly, the user can view an image that is read in with only a small time lag after a scanner has been instructed to fetch the image. It also makes it possible to read data from a CD-RW and write data to a CD-RW at high speed.

Use of the data transfer control device of these embodiments of the present invention in electronic equipment also makes it possible to ensure that the data transfer control device or the electronic equipment operates at a clock that is optimized to the transfer mode (HS mode or PS mode) of the other electronic equipment connected to the bus. This helps reduce the energy consumption of electronic equipment. Since it also prevents the generation of operating errors during clock switching, it enables improvements in the operating stability and reliability of electronic equipment.

Note that the electronic equipment that can employ a data transfer control device in accordance with the present invention is not limited to the above described embodiments, and thus various other examples can be considered, such as various types of optical disk drive (CD-ROM or DVD), magneto-optical (MO) disk drives, hard disk drives, TVs, VCRs, video cameras, audio equipment, telephones, projectors, personal computers, electronic organizers, and dedicated wordprocessors.

Note also that the present invention is not limited to the embodiments described herein, and various modifications are possible within the scope of the invention laid out herein.

For example, the configuration of the data transfer control device in accordance with the present invention is not limited to that shown in FIG. 1.

In addition, the configuration and operation of the clock generation means and the clock control means are not limited to those illustrated in FIGS. 2 to 7, and thus many modifications are possible.

Furthermore, the configurations of the first and second PLLs (the PLL480M and the PLL60M) are not limited to those described with reference to FIGS. 9 to 13B. For example, either some or all of the blocks other than the oscillation means (the VCOs 86 and 96) of the first and second PLLs (such as the phase comparison means, charge pump means, filter means, or clock divider means) could be made common between the first and second PLLs. This makes it possible to reduce the size of the clock generation means comprising these first and second PLLs.

It is particularly desirable to apply the present invention to data transfer under USB 2.0, but it is not limited thereto. For example, the present invention can also be applied to data transfer in accordance with a standard that is based on a concept similar to that of USB 2.0, or a standard that is developed from USB 2.0.

What is claimed is:

1. A data transfer control device for performing data transfer over a bus by using a first transfer mode which is high-speed mode or a second transfer mode which is low-speed mode, the data transfer control device comprising:

a clock generation circuit comprising a first PLL (phase locked loop)which generates a first clock and a second PLL which generates a second clock; and a clock control circuit which controls the first and second PLLs comprised within the clock generation circuit, wherein the clock control circuit disables autonomous operation of the first PLL, which generates the first clock used for the first transfer mode when the transfer mode has been switched from the first transfer mode to the second transfer mode;

wherein the data transfer control device detects whether or not a port connected to a bus supports the first transfer mode, in a state of operation in accordance with the first clock generated by the first PLL, and, when the data transfer control device detects that the first transfer mode is not supported by the port, the clock control circuit disables autonomous operation of the first PLL based on a selection signal from a later-stage data processing circuit; and wherein the clock control circuit disables autonomous operation of the first PLL at a timing between a first timing at which the data transfer control device can not detect a chirp from the port connected to the bus and a second timing at which data transfer control device starts transferring packets through the bus after an end of reset sequence.

2. The data transfer control device as defined in claim 1, wherein the clock control circuit enables autonomous operation of the second PLL before disabling autonomous operation of the first PLL, and disables autonomous operation of the first PLL after confirming that autonomous operation of the second PLL has stabilized.

3. The data transfer control device as defined in claim 1, wherein data transfer is in accordance with an universal serial bus (USB) standard.

4. Electronic equipment comprising:

the data transfer control device as defined in claim 1; and a device which performs output processing, fetch processing, or storage processing on data transferred through the data transfer control device and the bus.

5. Electronic equipment comprising:

the data transfer control device as defined in claim 3; and a device which performs output processing, fetch processing, or storage processing on data transferred through the data transfer control device and the bus.

* * * * *